United States Patent
Liao et al.

(10) Patent No.: US 10,337,689 B2
(45) Date of Patent: Jul. 2, 2019

(54) LIGHT EMITTING APPARATUS AND LIGHTING MODULE

(71) Applicant: EVERLIGHT ELECTRONICS CO., LTD., New Taipei (TW)

(72) Inventors: Yi-Hui Liao, New Taipei (TW); Chung-Wei Wang, New Taipei (TW); Shun-Chang Li, New Taipei (TW)

(73) Assignee: EVERLIGHT ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 15/892,010

(22) Filed: Feb. 8, 2018

(65) Prior Publication Data

US 2018/0283642 A1  Oct. 4, 2018

Related U.S. Application Data

(60) Provisional application No. 62/556,866, filed on Sep. 11, 2017, provisional application No. 62/535,246, (Continued)

(51) Int. Cl.
*F21S 43/14* (2018.01)
*F21S 43/20* (2018.01)
(Continued)

(52) U.S. Cl.
CPC .............. *F21S 43/26* (2018.01); *B60Q 1/0076* (2013.01); *B60Q 1/30* (2013.01); *F21S 43/14* (2018.01);
(Continued)

(58) Field of Classification Search
CPC .......... F21S 43/14; F21S 43/26; F21S 41/151; F21S 41/153; B60Q 1/30; B60Q 1/38; H01L 25/0753
(Continued)

(56) References Cited

U.S. PATENT DOCUMENTS 4,733,335 A * 3/1988 Serizawa ............... B60Q 1/302
362/503
8,136,963 B2 3/2012 Wang
(Continued)

FOREIGN PATENT DOCUMENTS

| CN | 101761788 A | 6/2010 |
|---|---|---|
| JP | 5145314 B2 | 2/2013 |
| TW | 1352179 B | 11/2011 |

*Primary Examiner* — Christopher M Raabe
(74) *Attorney, Agent, or Firm* — Sughrue Mion, PLLC

(57) ABSTRACT

The present invention provides a light emitting apparatus and a lighting module, comprising: a circuit substrate, a plurality of optical sources and an optical element; the optical element comprises a translucent element and an interference element; the plurality of light sources are arranged on the circuit substrate for lighting the optical element; the optical element is arranged above the plurality of light sources; and the interference element is arranged on the translucent element, which is used to make light emitted from each of the light sources offset interference in a first polarization direction, enhance interference in a second polarization direction, and emit through the translucent element. The light emitting apparatus and the lighting module of the present invention are employed to provide a more diversified optical pattern to the user and improve the user experience.

29 Claims, 17 Drawing Sheets

Related U.S. Application Data filed on Jul. 21, 2017, provisional application No. 62/479,345, filed on Mar. 31, 2017.

(51) Int. Cl.

| | |
|---|---|
| F21S 43/19 | (2018.01) |
| F21S 43/15 | (2018.01) |
| B60Q 1/00 | (2006.01) |
| B60Q 1/30 | (2006.01) |
| F21V 9/14 | (2006.01) |
| H01L 23/538 | (2006.01) |
| H01L 25/075 | (2006.01) |
| H01L 33/50 | (2010.01) |
| H01L 33/62 | (2010.01) |
| F21S 41/19 | (2018.01) |
| F21S 41/20 | (2018.01) |
| F21W 106/00 | (2018.01) |
| F21S 41/153 | (2018.01) |
| F21S 41/151 | (2018.01) |
| F21Y 115/10 | (2016.01) |
| H05B 33/08 | (2006.01) |

(52) U.S. Cl.
CPC .............. *F21S 43/15* (2018.01); *F21S 43/19* (2018.01); *F21S 43/195* (2018.01); *F21V 9/14* (2013.01); *H01L 23/5387* (2013.01); *H01L 25/0753* (2013.01); *H01L 33/502* (2013.01); *H01L 33/62* (2013.01); *F21S 41/151* (2018.01); *F21S 41/153* (2018.01); *F21S 41/19* (2018.01); *F21S 41/285* (2018.01); *F21W 2106/00* (2018.01); *F21Y 2115/10* (2016.08); *H05B 33/0842* (2013.01); *H05B 33/0887* (2013.01)

(58) Field of Classification Search
USPC .......................................................... 362/19
See application file for complete search history.

(56) References Cited

U.S. PATENT DOCUMENTS

| | | | |
|---|---|---|---|
| 2001/0017970 A1 | 8/2001 | Shie et al. | |
| 2002/0024822 A1* | 2/2002 | Pond | B60Q 1/2607 362/555 |
| 2011/0204401 A1* | 8/2011 | Kim | H01L 33/10 257/98 |
| 2013/0027703 A1* | 1/2013 | Shau | G01N 21/3504 356/364 |
| 2017/0059961 A1 | 3/2017 | Park et al. | |

* cited by examiner

LIGHT EMITTING APPARATUS AND LIGHTING MODULE

TECHNICAL FIELD

This invention relates to the field of vehicle lighting and, in particular, to a light emitting apparatus and a lighting module.

BACKGROUND

Tail lamp generally refers to the lamps mounted on the back of vehicles, and the main color of tail lamps is usually red. The tail lamps may play different roles in different colors, for example, a red brake lamp (width lamp) is used to alert following vehicles, an amber turn lamp is used to indicate directions, and a white reversing lamp is used to serve as an auxiliary observation.

Existing tail lamps generally use light-emitting diodes (LEDs) as light source, as shown in FIG. 1. Since LED light source is a point light source, an optical pattern generated by a LED light source can be a halo pattern which includes a bright region and a dark region. The bright region is at a relatively central position, and the dark region is near the edge of the halo pattern, outside the bright region. The light intensity presented by the optical pattern will be proportionally and gradually increased from outside to inside in a direction of X-axis or Y-axis.

However, in the prior art, such tail lamps can only present a circular shape with brightness gradually changing from center to outer edge, which cannot meet the diversified requirements of the optical effect design of the automobile tail lamps.

SUMMARY

In view of the above defects in the prior art, the present invention provides a light emitting apparatus and a lighting module, so as to solve the problem that the prior art cannot meet the diversified requirements of the optical effect design of the automobile tail lamps.

A light emitting apparatus is provided according to a first aspect of the present invention, including: a circuit substrate, a plurality of optical sources and an optical element, where the optical element comprises a translucent element and an interference element;

the plurality of light sources are arranged on the circuit substrate for lighting the optical element;

the optical element is arranged above the plurality of light sources; and the interference element is arranged on the translucent element, where the interference element is configured to make light emitted from each of the light sources offset interference in a first polarization direction, enhance interference in a second polarization direction, and emit through the translucent element.

A lighting module is provided according to a second aspect of the present invention, including: the light emitting apparatus according to the first aspect and a control circuit, where the control circuit is configured to control the on and off of the plurality of light sources in the light emitting apparatus.

The light emitting apparatus provided in the embodiments of the present invention can be used in various lighting modules, such as a tail lamp design, a brake lamp design, a headlamp design, or a vehicle interior lighting, so as to provide more diversified optical patterns and improve user experience.

DESCRIPTION OF EMBODIMENTS

Some implementations of the present invention are illustrated in detail with reference to the accompanying drawings below. The following embodiments and the features in the following embodiments can be combined with each other without conflict.

As described in the background, in the related art, an optical pattern generated by a LED light source is generally a circular halo pattern, thus, tail lamps with LED light sources cannot provide diversified optical patterns according to actual requirements of users. The present invention uses an optical element with an interference element to interfere with the lights generated by the light sources to generate a more diversified light pattern. In addition, the present invention also provides a plurality of different arrangement manners of the light sources on the circuit substrate, so as to generate a user-expected pattern and improve the user experience.

The optical element is arranged above the LED light source, thus, the light emitted from the LED light source reaches the optical element, passes through the optical element after possible reflection and scattering, and finally forms an optical pattern, that is, forms a halo pattern on a surface of the optical element, as described in the related art. The present invention aims at using an optical element having an interference element to change the above halo pattern to a line pattern. With this arrangement, light emitted from a plurality of light sources not only undergoes reflection and scattering but also undergoes interference of the light at the interference element, therefore, the above halo pattern can be changed to a stripy line pattern via this interference.

The light emitting apparatus provided by the present invention will be described in detail below.

Figure 2A:
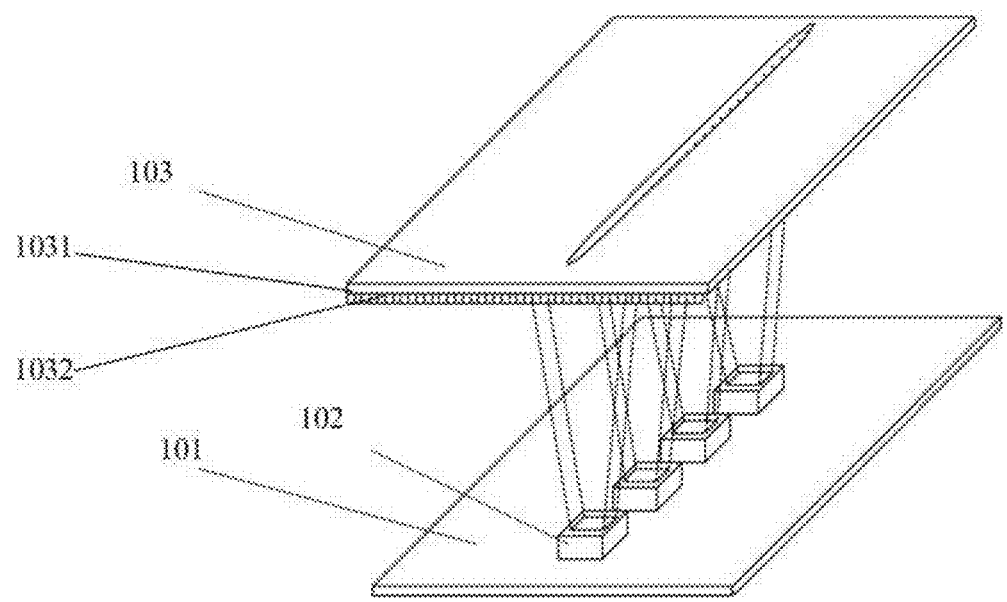
FIG. 2A is a structural diagram of a light emitting apparatus according to an embodiment of the present invention.

FIG. 2A is a structural diagram of a light emitting apparatus according to an embodiment of the present invention. As shown in FIG. 2A, the light emitting apparatus 100 includes: a circuit substrate 101, a plurality of light sources 102 and an optical element 103.

Specific to the arrangement manner, the plurality of light sources 102 are arranged on the circuit substrate 101 for lighting the optical element 103. The light sources here can be any apparatus capable of playing a lighting role. Generally, the light sources can be a LED light source, and the following embodiments will be illustrated by taking the LED light sources as an example, but not limited thereto. Optionally, the LED here can choose a Lambertian light source with features of a 60 degrees half power angle. The half power angle here is also called 3 dB beamwidth or half power beamwidth, which refers to an angle between two points where the power fluence density relative to the maximum radiation direction is decreased to a half (or less than the maximum value of 3 dB) in a certain plane containing the maximum radiation direction of the main lobe in the power pattern.

The optical element 103 is arranged above the plurality of light sources 102. From the point of structure, the optical element 103 includes a translucent element 1031 and an interference element 1032, and the interference element 1032 is arranged on the translucent element 1031, and is used to make the light emitted from each of the light sources 102 offset the interference in a first polarization direction and enhance the interference in a second polarization direction, and then emit through the translucent element 1031. The optical element has high translucency. As an optional embodiment, the translucent element 1031 can include a translucent substrate and an optical translucent layer, and the above interference element 1032 can be substantially arranged on the optical translucent layer, and the material of the optical translucent layer can be the same as that of the translucent substrate. Moreover, the optical translucent layer and the translucent substrate can be integrally formed, or after the optical translucent layer is formed on the translucent substrate, the interference element 1032 is formed on the optical translucent layer. Optionally, the interference element on the optical translucent layer can be formed by means of mold manufacturing, sandblasting, chemical etching, embossing, laser etching, or the like. The main material of the optical element can be formed by UV-polycarbonate, polyester, acrylic, and UVT acrylic.

Figure 1:
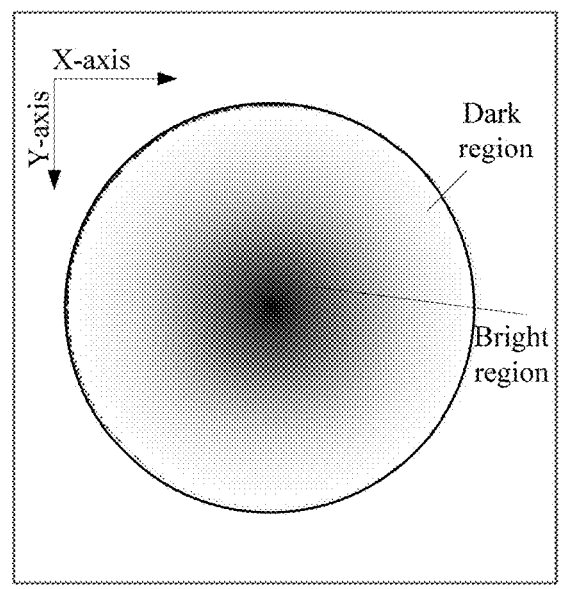
FIG. 1 is a schematic diagram of an optical pattern of a LED light resource in the prior art.
Figure 2B:
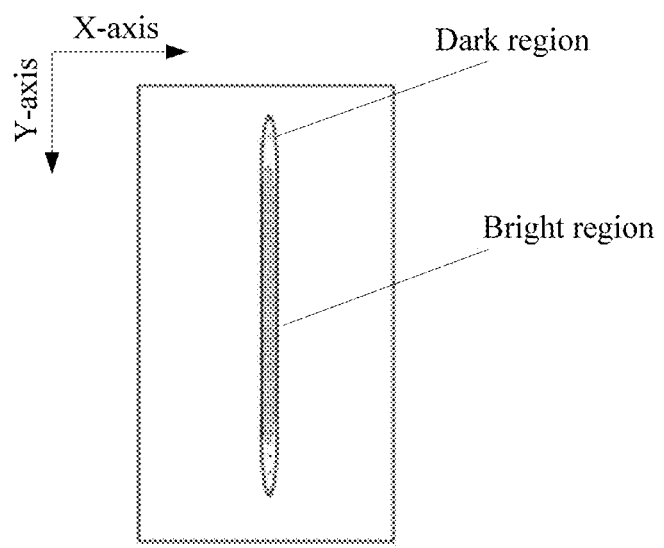
FIG. 2B is a schematic diagram of an optical pattern according to an embodiment of the present invention.

The optical element according to the present invention is capable of generating interference phenomena on the light emitted by the light sources to form a specific asymmetrical optical pattern, and the interference phenomenon is mainly realized by an interference element on the optical element. Optionally, the above interference element can be patterned, and the patterned interference element can interfere with the light emitted by the light sources to generate a specific asymmetrical optical pattern, and at the same time, it maintains, for example, more than 80% of the light transmittance rate. The interference element having both of characteristics of a constructive interference and a destructive interference, interferes with the light emitted from the light sources, such that the light emitted from the plurality of light sources offsets the interference in the first polarization direction (X-axis direction), undergoing the destructive interference, and enhances the interference in the second polarization direction (Y-axis direction), undergoing the constructive interference. Therefore, the halo pattern can be changed to a line pattern in this way. In order to describe the interference process more clearly, it is illustrated below with reference to FIG. 1. As can be seen from FIG. 1, the halo pattern can be divided into two regions, i.e., a dark region in the periphery and a bright region in the center. After passing through the interference element, the light emitted by the light sources undergoes the destructive interference and the constructive interference in different directions, thus the light in X-axis direction undergoes the destructive interference which reduces the optical pattern region in X-axis direction, and the light in Y-axis direction undergoes the constructive interference which increases the optical pattern region in Y-axis direction. As such, an area of the halo pattern in X-axis direction is destroyed, while an area of the halo pattern in Y-axis direction is increased. Finally, a line pattern as shown in FIG. 2B is formed, presenting an elongated optical pattern effect. Corresponding with the bright region and the dark region of the halo pattern, in the line pattern as shown in FIG. 2B, the center is a bright region and the both ends are dark regions. That is, the dark regions of the optical pattern are mainly distributed at the both ends of the elongated optical pattern, and the bright region of the optical pattern is distributed at the center of the elongated optical pattern. It should be noted that the optical pattern formed by the light element used in the present invention is not limited to the above shapes. The ratio and position of the dark regions and bright regions can be achieved by adjusting the geometry and direction of the interference element according to specific design requirements. For example, an optical pattern with no difference between dark and bright regions can be obtained through appropriate interference elements.

Optionally, the interference element of the above pattern can include a plurality of micro units, which can be regularly arranged or irregularly arranged. The interference element can be isotropic, that is, directions of the micro units in the arrangement are the same, or the interference element can be anisotropic, that is, directions of the micro units in the arrangement are different. The geometries of the micro units can be triangles, squares, rectangles, hexagons, cones, ellipsoids, stereoscopic undulating or the base of other polygons, which are not limited herein. The micro units can be convexes that extend from the surface or can be concaves that recess into the surface. These micro units can be arranged closely to each other, or the interval densities between the micro units can be adjusted according to requirements. The micro units can be arranged to a concavo-convex surface, where the distance between the lowest point and the highest point thereof is not more than 500 micrometers. Preferably, it is 100 micrometers, and more preferably, it is 30 micrometers. The smaller the concavity and convexity depth of the concavo-convex surface, the more the micro units that can be arranged, so that the interference effect can be increased.

Figure 3A:
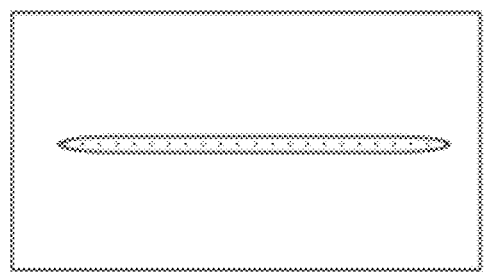
FIG. 3A is a schematic diagram of an optical pattern according to an embodiment of the present invention.
Figure 3B:
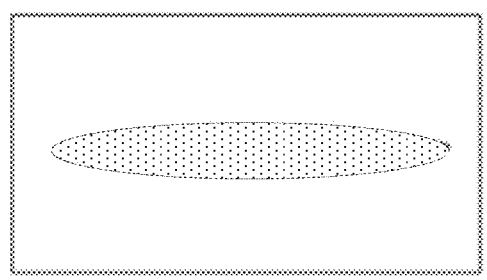
FIG. 3B is a schematic diagram of another optical pattern according to an embodiment of the present invention.
Figure 3C:
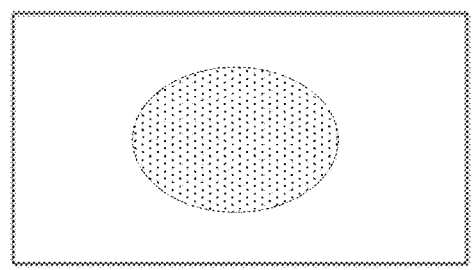
FIG. 3C is a schematic diagram of yet another optical pattern according to an embodiment of the present invention.

As described above, a feasible implementation manner is that the interference element is formed by means of mold manufacturing, sandblasting, chemical etching, embossing, laser etching, or the like. Therefore, during the manufacturing, the finally formed length and width of the line pattern can be adjusted by adjusting manufacturing angles of the micro units. In fact, precise control on shapes of the line pattern can be realized by precisely calculating the manufacturing angles of the micro units. For example, FIGS. 3A-3C illustrate different optical patterns under different manufacturing angles. The manufacturing angles can include a first twisting angle in X-axis direction and a second twisting angle in Y-axis direction. In FIG. 3A, the first twisting angle is 1 degree and the second twisting angle is 60 degree, while in FIG. 3B, the first twisting angle is 5 degree and the second twisting angle is 30 degree. It is clear that the bigger the first twisting angle is, the poorer the effect of the destructive interference in X-axis direction is, which renders the line pattern wider in X-axis direction. This can be more clear in FIG. 3C, where only the second twisting angle is 30 degree, and the first twisting angle is 0 degree, thus, the light emitting from the light sources experiences no destructive interference in X-axis direction and the finally formed optical pattern is more like a blurry halo pattern.

Figure 4A:
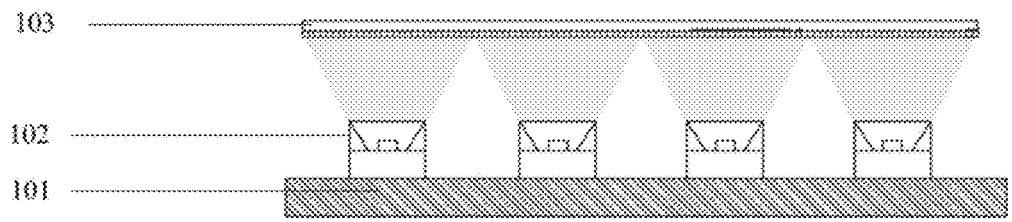
FIG. 4A is a schematic diagram of an arrangement of a LED according to an embodiment of the present invention.
Figure 4B:
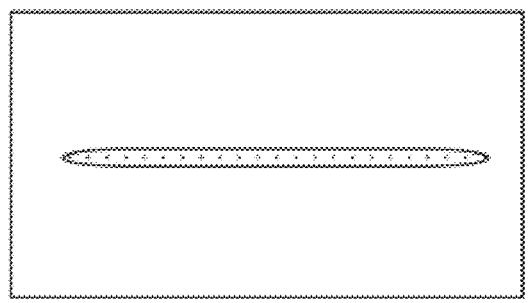
FIG. 4B is a schematic diagram of another optical pattern according to an embodiment of the present invention.
Figure 4C:
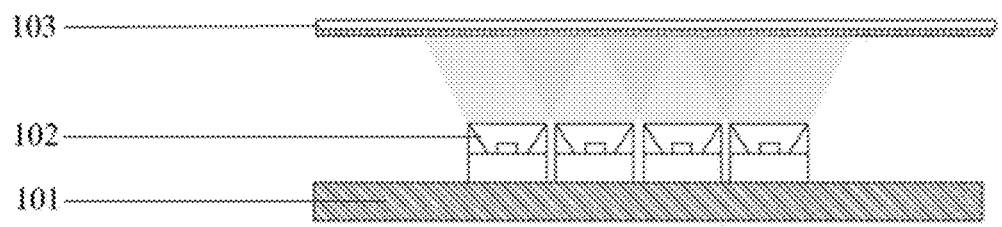
FIG. 4C is a schematic diagram of an arrangement of a LED according to an embodiment of the present invention.

In addition, the lights emitted from each of the light sources form an independent elongated optical pattern on the optical element 103, and the dark regions or bright regions of the independent optical patterns may be connected to each other or overlapped, so that the finally formed optical pattern can present a uniform light intensity. Therefore, there is no particular limit on the distance between the plurality of light sources 102, and if an elongated shape optical pattern as shown in FIG. 2B is to be formed, the bright region or dark region of the original light emitted from the plurality of light sources 102 do not overlap or overlap with each other, as shown in FIG. 4A. If the bright region and the dark region do not overlap each other, the optical element capable of achieving a uniform optical pattern can be selected. Therefore, after each of the independent light sources passes through the optical element 103, the end to end connection of each of the elongated optical patterns can be presented on the surface of the optical element 103, thus a continuous elongated optical pattern is formed, as shown in FIG. 4B, and the light intensities of each of the regions of the continuous elongated optical pattern are substantially the same. Optionally, if the optical element that causes the dark region and the bright region is selected, the light emitted from the light sources 102 can overlap each other, as the arrangement manner shown in FIG. 4C. The overlapped area can be, for example, 5% to 80%, and the specific value can be determined according to actual requirements. Therefore, the formed optical pattern can be shown in FIG. 4D. By increasing the number of light sources, the bright regions of the central part of the continuous elongated optical pattern can be extended, while the dark regions are still only distributed at the two ends of the optical pattern.

Figure 4D:
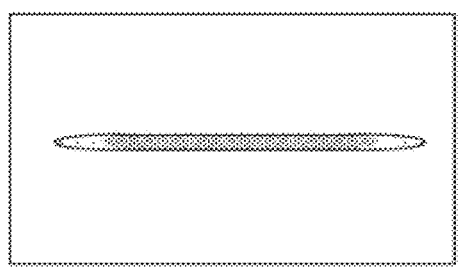
FIG. 4D is a schematic diagram of another optical pattern according to an embodiment of the present invention.

In addition, as shown in FIGS. 4B and 4D, the optical pattern formed thereon is linear. Of course, optionally, it can also possible to consider bending the optical element 103 to form a curved optical pattern. At this time, in order to maintain the uniformity of the light intensity of the optical pattern, if the Lambertian light sources are selected as the light sources 102, the light emitted from each light sources are required to overlap each other over 5% to 80%.

Optionally, the above-mentioned circuit substrate 101 can be formed by combining a flexible circuit board and a substrate. By adjusting the distance between the circuit substrate and the optical element, an optical pattern with different brightness can be obtained.

It should be noted that the relative positions, sizes, and number of light sources of the above components are merely illustrative, but not limited thereto, and those skilled in the art may make appropriate changes according to actual requirements.

The light emitting apparatus provided in the embodiments of the present invention can be used in various lighting modules, such as a tail lamp design, a brake lamp design, a headlamp design, or a vehicle interior lighting, so as to provide more diversified optical patterns and improve user experience.

Figure 5:
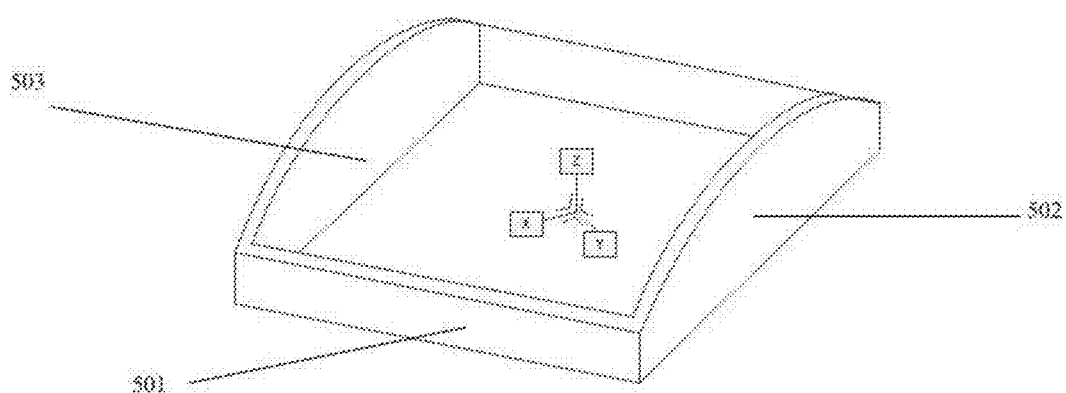
FIG. 5 is a schematic diagram of an optical element according to an embodiment of the present invention.

As described above, by using the interference element, the light emitted from the LED is interfered, thereby forming an elongated optical pattern on the surface of the optical element. In order to obtain a more stereoscopic pattern, another alternative solution of the present invention is that the optical element can be selected to be twisted by a certain angle, so that an optical pattern with stereoscopic curved shape is presented when viewed from the top of the light emitting apparatus. It should be illustrated that in practical applications, more different optical patterns can be obtained by changing the curvature of the optical element. The surface of the optical element facing the light sources can be curved in the direction away from the light sources. Taking FIG. 5 as an example, where a curved optical element is shown as an important part of the light emitting apparatus, and a more stereoscopic optical pattern can be obtained after the optical element is curved. As shown in FIG. 5, the outer surface of the optical element is arc-shaped, and its curving direction is curved in a direction away from the light sources arranged on the circuit substrate. Optionally, the cross section 501 of the optical element, which is a plane parallel to the plane consisting of the Y-axis and the Z-axis, can be a rectangular; while the upper edge of the cross section 502 thereof is arc-shaped. It can be understood that the curvature of the optical element can be changed according to the actual requirements, so as to obtain different optical patterns.

In addition, it should be noted that the optical element shown in FIG. 5 is a symmetrical structure, therefore, the radians of the outer edges thereof are equal, and the cross sections 502 and 503 of the outer edges are also equal. However, it is understood that in practice, the shape of the optical element, including the radian of the out edge etc., can be changed according to actual requirements. The shape of the optical element is merely illustrative, but not limited thereto.

As described above, in the arrangement of the above curved optical element, the factors such as the curvature and the angles of the optical element on different axes can be taken into consideration. Where the curvature can be used to describe the curve degree of the outer surface of the optical element, that is, the curvature can reflect the arc-shaped curve degree of the outer edge of the optical element; and in Cartesian coordinates, the above-mentioned different axes refer to X-axis, Y-axis and Z-axis, as shown in FIG. 5.

Figure 6:
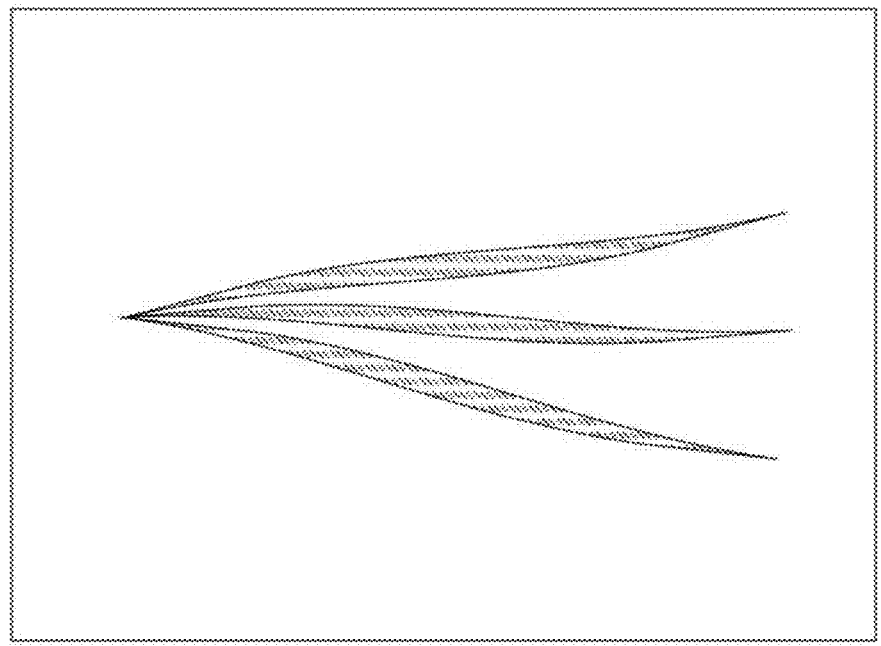
FIG. 6 is a schematic diagram of another optical pattern according to an embodiment of the present invention.

Optionally, a curved optical element as shown in FIG. 5 can be used to divide a plurality of LEDs into multiple sets, where the LEDs in each set are in series with each other in a straight line, and the multiple sets of LEDs are in parallel with each other. The optical element made of micro units with the same direction is used on the LEDs. The optical element is further curved to form a curved surface. Therefore, when the light sources emitted by the different sets of LEDs pass through the optical element, multiple sets of curved optical patterns with same direction can be formed on the surface of the optical element, by curving the optical element properly, the different sets of curved optical patterns with equal directionality approach to each other or overlap with each other at either end of the two ends, however, the optical patterns separate from each other at the center of the curved optical patterns, as shown in FIG. 6.

The light emitting apparatus provided in the embodiments of the present invention can be used in various lighting modules, such as a tail lamp design, a brake lamp design, a headlamp design, or a vehicle interior lighting, so as to provide more diversified optical patterns and improve user experience.

In implementation of the present invention, the following factors can be taken into consideration when setting the LEDs: the distance among the plurality of LEDs, the distance between the plurality of LEDs and the circuit substrate, the twisting angle of the plurality of LEDs with respect to the circuit substrate, and the angle between the arrangement direction of the plurality of LEDs and the direction of the micro units in the interference element in the optical element. The specific effects of the above factors on the finally formed optical pattern will be illustrated below with reference to specific embodiments.

As described above, the interference element can be made of micro units with the same direction or different directions. In the second case, the interference element can include at least two types of micro units, where the number of each type of micro units is multiple; and the directions of the same type of micro units are the same, and the directions of different types of micro units are different. The arrangement manners of the LEDs are important to the directivities of the micro units in the interference element. According to the different directivities of the interference element, the solution of the present invention is illustrated in detail with reference to the different arrangement manners of the LEDs.

1) In case of the interference element is made up of micro units with the same direction.

A plurality of LEDs can be in series with each other and arranged linearly on the circuit substrate along the same direction as that of the micro units. In this arrangement manner, as shown in FIG. 2A, a plurality of LEDs are arranged in a line to finally form a linear optical pattern on the surface of the optical element.

At this time, by changing the half power angle of the LED or changing the setting plane thereof, the optical pattern with different degrees of uniformities, that is, the optical pattern with the light and the dark can be obtained.

As a feasible implementation, a plurality of LEDs can be divided into at least two sets, where the half power angle of the same set of LEDs is the same, and the half power angles of the different sets of LEDs are different; and the half power angles of the LEDs are different from the half power angles of the light sources arranged on both adjacent sides thereof. That is, the LEDs with different half power angles are arranged at intervals. Optionally, at least two sets of control circuits can be arranged on the circuit substrate, which correspond to the at least two sets of LEDs, respectively. Where each set of the control circuits is electrically connected with each set of LEDs to drive the set of LEDs.

Figure 7:
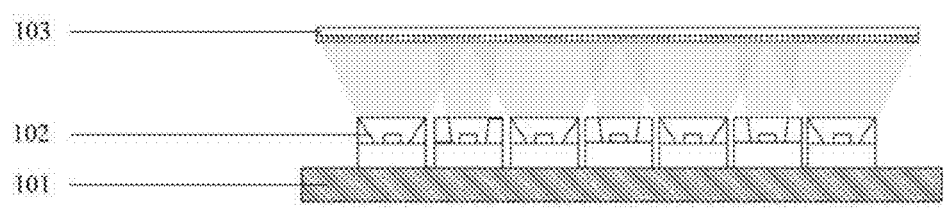
FIG. 7 is a schematic diagram of an arrangement of a LED according to an embodiment of the present invention.
Figures 8A, 8B, 8C:
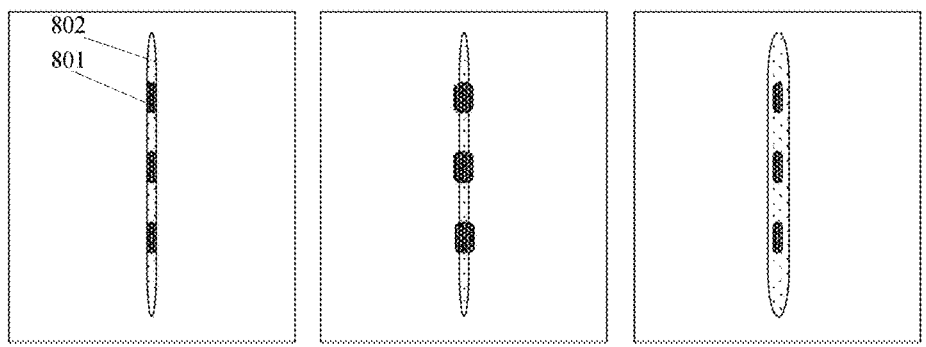
FIG. 8A is a schematic diagram of another optical pattern according to an embodiment of the present invention.
FIG. 8B is a schematic diagram of another optical pattern according to an embodiment of the present invention.
FIG. 8C is a schematic diagram of another optical pattern according to an embodiment of the present invention.

FIG. 7 is a schematic diagram of an arrangement of a LED according to an embodiment of the present invention. As shown in FIG. 7, a plurality of LEDs 102 are arranged on the circuit substrate 101, and different sets of LEDs 102 can be in series with each other and can be controlled through different control circuits. After passing through the optical element 103, the light sources finally formed by the plurality of LEDs 102 can generate two different optical patterns. The first set of LEDs 102 can emit a light sources with a half power angle of 60 degree, the second set of LEDs 102 can emit light sources with a half power angle of 30 degree, and the LEDs 102 in the first and second sets are alternately arranged in a line. Therefore, in general, the first set of LEDs 102 will be controlled by the first set of control circuits to be continuously lit, so that an elongated optical pattern with uniform light intensity can be formed. The second set of LEDs 102 will be controlled by the second set of circuits to be lit in particular situation. The finally formed optical pattern of the LEDs in the embodiment is shown in FIG. 8A, since the LEDs 102 in the embodiment have different half power angles, when the first and second sets of LEDs 102 are lit at the same time, the first LEDs 102 can still form a first optical pattern 801 with uniform light intensity, however, due to the smaller half power angle, the second LEDs 102 can form a second optical pattern 802 on the first optical pattern 801 after interfered by the interference element. And the light intensity of the second optical pattern 802 is greater than the light intensity of the first optical pattern 801, however, the width of the first optical pattern 801 is substantially the same as that of the second optical pattern 802, as shown in FIG. 8A. Of course, the widths of the first and second optical patterns in the present invention can be changed according to design requirements, for example, the width of the second optical pattern can be larger or smaller than that of the first optical pattern, as shown in FIGS. 8B and 8C. In addition, the above respective optical pattern can also have the difference between the bright region and the dark region, for example, the first optical pattern can be an optical pattern with uniform light intensity, and the second optical pattern can be an optical pattern with a dark region and a bright region.

As another feasible implementation, a plurality of LEDs can be divided into at least two sets, where the half power angles of the respective LEDs are the same; and the height of the surface of the circuit substrate where respective LED is located is different from that of the surface of the circuit substrate where the LEDs arranged on both adjacent sides thereof are located. That is, the LEDS are arranged at intervals on different surfaces of the circuit substrate. Optionally, at least two sets of control circuits can be arranged on the circuit substrate, and the at least two sets of control circuits correspond to the at least two sets of LEDs, respectively, and each set of the control circuits are electrically connected to each set of LEDs to drive the set of LEDs. As shown in FIG. 8A, an optical pattern with a strong light intensity in particular region can also be achieved by this arrangement manner.

Figure 9A:
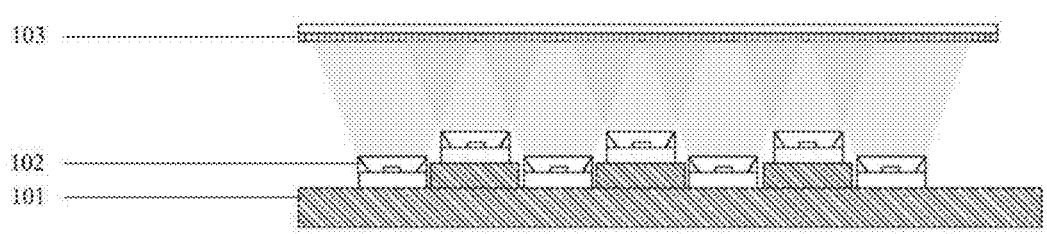
FIG. 9A is a schematic diagram of an arrangement of a LED according to an embodiment of the present invention.
Figure 9B:
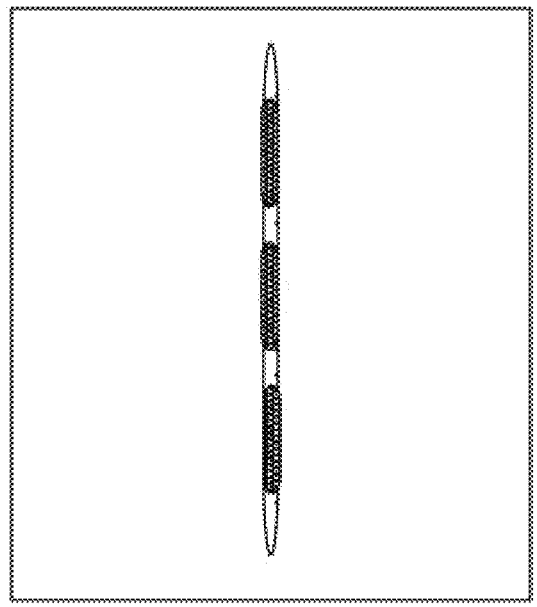
FIG. 9B is a schematic diagram of another optical pattern according to an embodiment of the present invention.

FIG. 9A is a schematic diagram of an arrangement of a LED according to an embodiment of the present invention. As shown in FIG. 9A, the LEDs 102 are arranged on the circuit substrate 101, which are realized by the stereoscopic structure of the circuit substrate. As shown in FIG. 9A, the first and second sets of LEDs 102 that can emit the same half power angle are arranged in the light emitting apparatus. The driving modes of the two sets of LEDs 102 are the same as those in the above embodiment, however, the LEDs 102 in the first set and the second set can also be alternately arranged in a line with each other. However, the circuit substrate 101 has an upper surface with different heights, and the first and second sets LEDs 102 are arranged on the surface of the circuit substrate 101 with different heights. For example, the first set of LEDs 102 continuously driven to be lit are arranged on the surface of the lower circuit substrate 101, however, the second set of LEDs 102 intermittently driven can be arranged on the higher circuit substrate 101. Therefore, as shown in FIG. 9B, with the stereoscopic structure on the circuit substrate, the similar optical pattern having the same effect with that of the optical pattern in the previous embodiment can be achieved. It should be noted that, when a design of high-low step is adopted in the circuit substrate 101, it should be noted that the LEDs 102 arranged on the surface of the higher circuit substrate 101 do not interfere or block the light emitted by the LEDs 102 located on the lower surface. If a phenomenon of blocking the light sources is occurred due to the arrangement of the LEDs, the blocking effect caused by the blocking can be compensated and reduced through the overlapping light sources, for example, the overlapping area among the light sources can be 5%-80%, or more preferably the overlapping area is 20%-60%, while maintaining the light uniformity of optical pattern. In this embodiment, neither the number of the LEDs 102 on each surface, nor the use of the LEDs 102 emitting light with different half power angles is limited. Therefore, the LEDs 102 emitting lights with different half power angles can be matched with the stereoscopic circuit substrate to achieve an approximate effect of the optical pattern.

It should be illustrated that the above embodiment are described by using only two sets of LEDs as an example. It can be understood that in practice, more sets of LEDs with different half power angles can be arranged to obtain more diversified optical patterns.

2) In case of the interference element is made up of micro units with the different direction.

In this case, a plurality of LEDs can be one set, or be divided into multiple sets, and the two cases are respectively described hereafter.

In an embodiment, a plurality of LEDs are in series with each other and are linearly arranged on the circuit substrate along a direction different from the direction of the micro units. That is, there is an angle between the direction of the plurality of LEDs and the direction of the micro units. It should be noted that, the optical patterns shown below are obtained when the optical elements are not curved. Therefore, the finally obtained optical patterns are all straight lines. Of course, a curved optical element can also be used in practice and then the obtained optical pattern is curved.

Figure 10A:
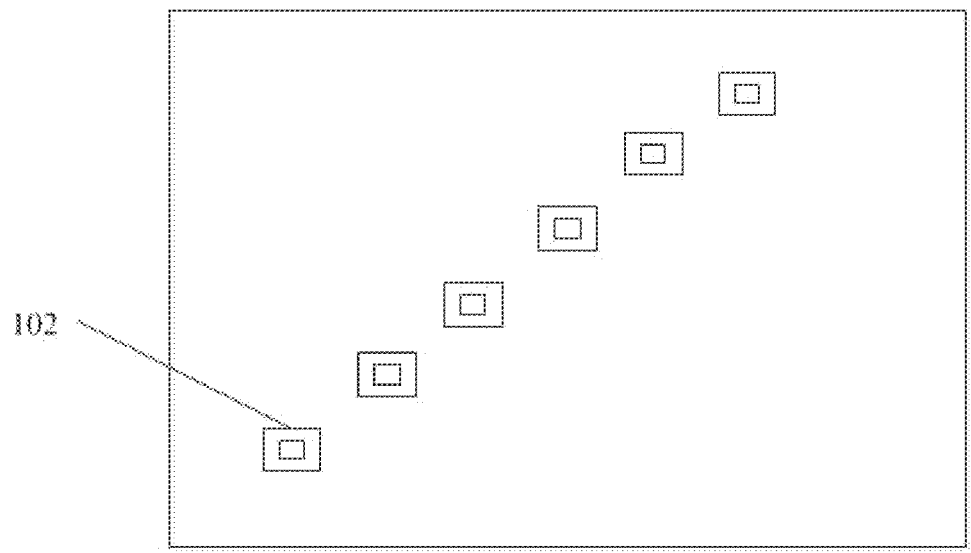
FIG. 10A is a schematic diagram of an arrangement of a LED according to an embodiment of the present invention.
Figure 10B:
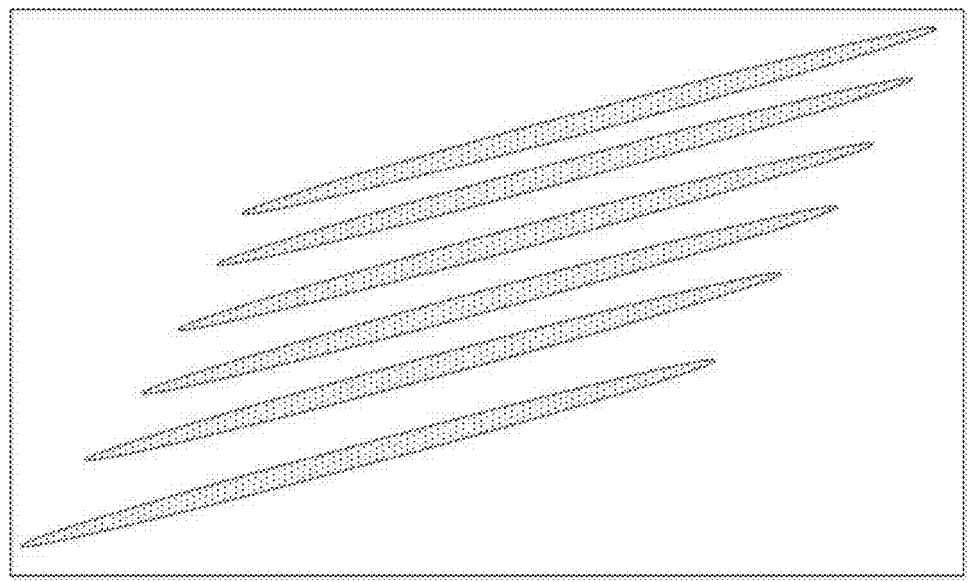
FIG. 10B is a schematic diagram of another optical pattern according to an embodiment of the present invention.
Figure 11:
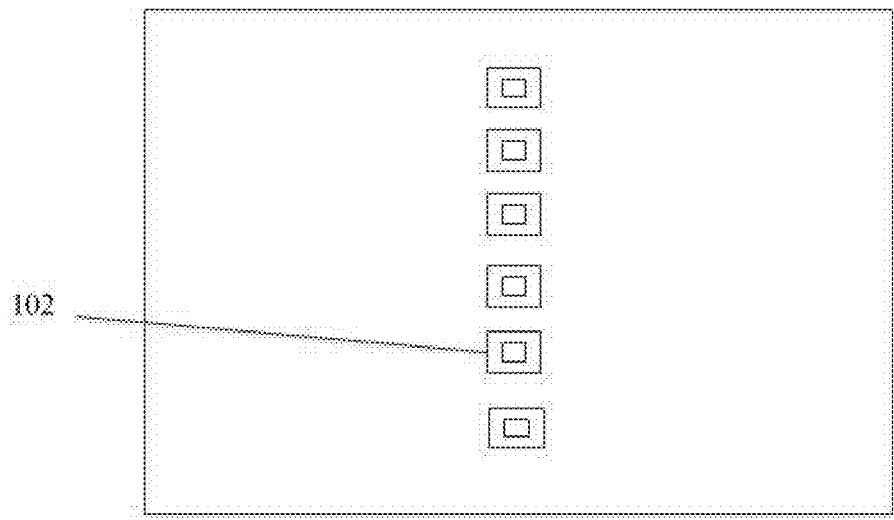
FIG. 11 is a schematic diagram of an arrangement of a LED according to an embodiment of the present invention.
Figure 12:
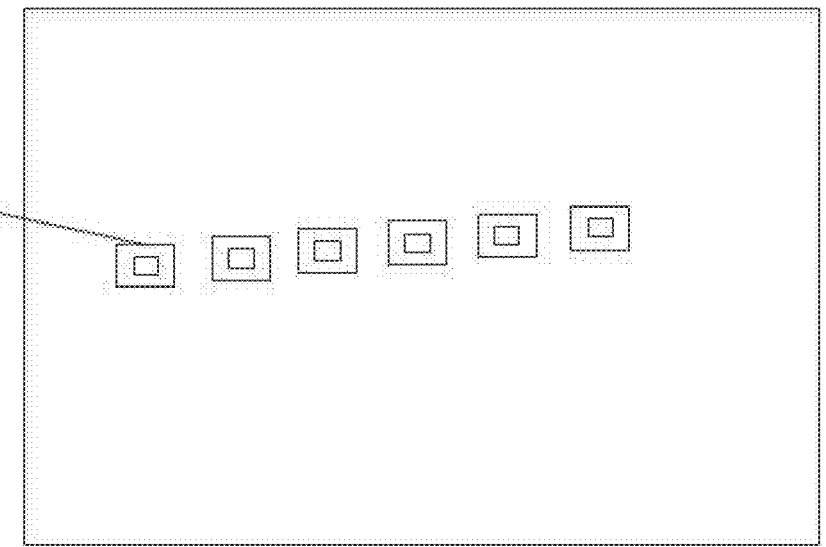
FIG. 12 is a schematic diagram of an arrangement of a LED according to an embodiment of the present invention.
Figure 13:
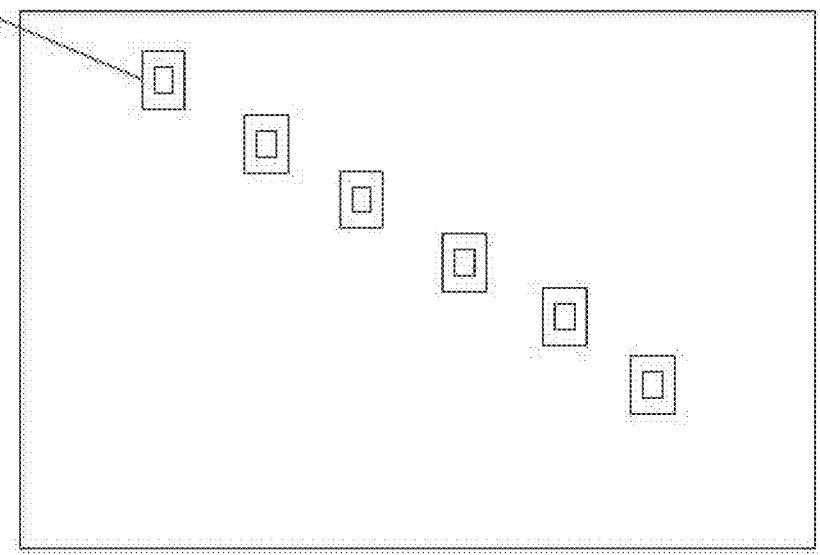
FIG. 13 is a schematic diagram of an arrangement of a LED according to an embodiment of the present invention.
Figure 14:
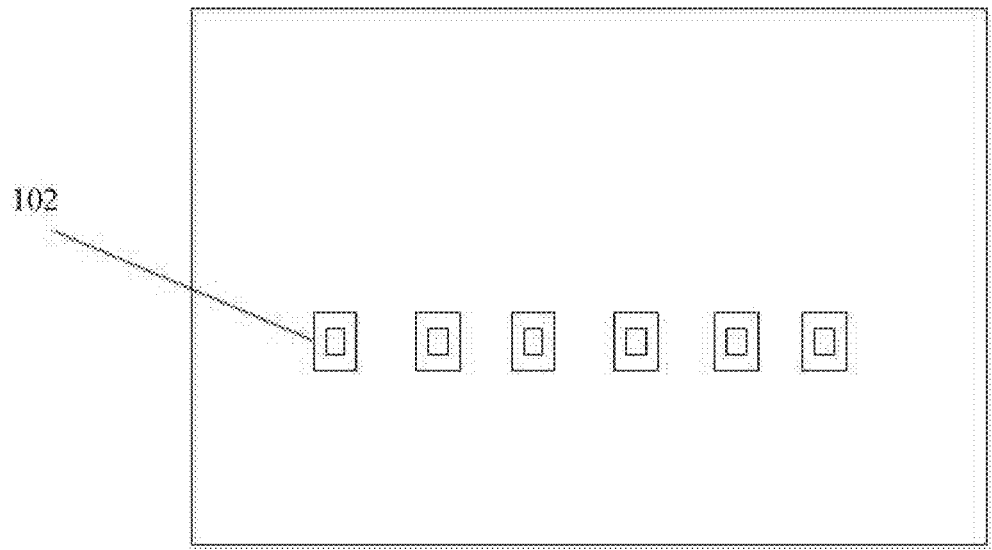
FIG. 14 is a schematic diagram of an arrangement of a LED according to an embodiment of the present invention.

As shown in FIG. 10A, a plurality of LEDs are arranged in a direction that is not parallel to the micro units, and a optical pattern formed thereon is shown in FIG. 10B. In this optical pattern, the number of lines is the same as that of LEDs. In addition, since the plurality of LEDs are arranged at equal intervals, the respective lines in the optical pattern are parallel and are equally spaced. Of course, the other optical patterns can also be obtained by setting the LEDs at different intervals, which is not limited herein. And the number of LEDs can also be changed according to actual requirements.

It should be noted here that the LEDs in FIG. 2A are arranged in a line, and the LEDs in FIG. 10A are also arranged in a line, however, the optical patterns obtained by the two are different. The reason is that the arrangement direction of the LEDs in FIG. 2A is consistent with the direction of the micro units in the interference element, where the optical pattern formed by the LEDs on the surface of the optical element are connected end to end to form an elongated line pattern; however, in FIG. 10A, the arrangement direction of the LEDs is not consistent with that of the micro units in the interference element, therefore, a plurality of parallel line patterns can be obtained finally. In the following embodiments, a plurality of line patterns are obtained from a set of LEDs based on the same principle as above, and the formation principle thereof will not be described in detail hereafter. It should be illustrated that, as long as the arrangement direction of the LEDs is not consistent with that of the micro units in the interference element, a plurality of parallel line patterns can be obtained. It is only shown here that a plurality of lines are obtained by adjusting the arrangement direction of the LEDs. It is of course possible to change the direction of the micro units when implementing the solution of the present invention. For example, as shown in FIG. 2A, it can be achieved by simply rotating the optical element.

In other embodiments, FIG. 11 to FIG. 14 show different arrangement manners of the LEDs, and the difference lies only in the distance between the LEDs or the angle between the arrangement direction of the LEDs and the direction of the micro units, and the principle of generating optical pattern is similar to that of the above figures and will not be shown here. It should be illustrated that the arrangement manner of the LEDs listed here are only examples, but not limited thereto. In practice, it can be changed according to specific requirements to obtain an appropriate optical pattern.

In addition, multiple sets of LEDs can be arranged to create more complex optical patterns. For example, a plurality of LEDs can be divided into two sets, three sets, four sets or even more sets. Each set of LEDs can be arranged in parallel with each other or cross each other, and only a part of sets of LEDs in all sets can be arranged in the same direction. For each set of LEDs, the number of LEDs is the same as that of lines in the finally formed optical pattern, and the spacing between the LEDs can also be changed according to actual requirements.

In another embodiment, the plurality of light sources are divided into at least two sets; and the light sources in each set are in series with each other and linearly arranged on the circuit substrate along a direction different from the direction of the micro units.

Figure 15:
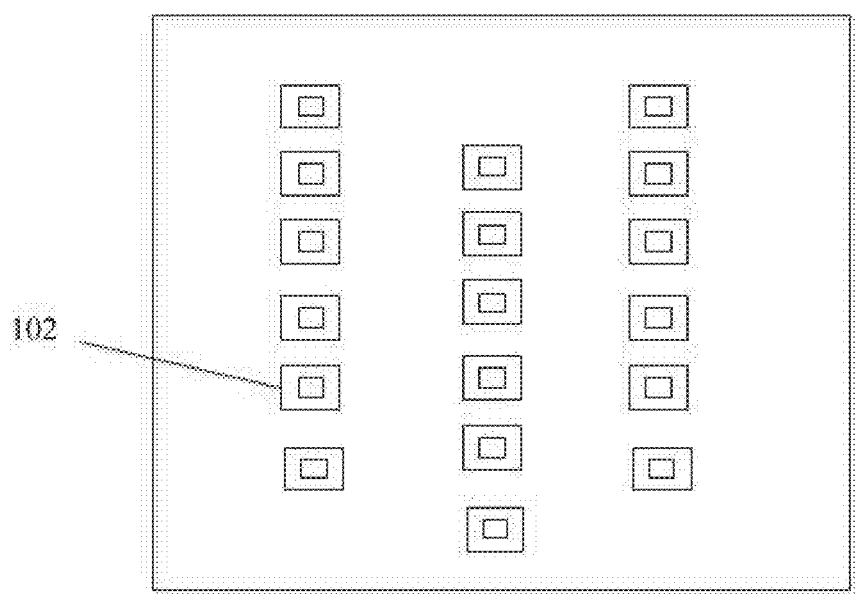
FIG. 15 is a schematic diagram of an arrangement of a LED according to an embodiment of the present invention.

As shown in FIG. 15, the arrangement directions of each set of the light sources on the circuit substrate are parallel to each other. In this case, the plurality of LEDs are divided into three sets, and the surface of the circuit substrate where the set of light sources arranged in the middle is located, is lower than the surface of the circuit substrate where the two sets of light sources on the two adjacent sides are located. The optical pattern obtained in this case can be that three lines respectively correspond to three sets of LEDs, and the line in the middle is farther than the lines on both sides thereof, so that a more stereoscopic optical pattern effect is obtained.

In addition, the arrangement direction of the each set of LEDs on the circuit substrate can be different from each other.

Figure 16:
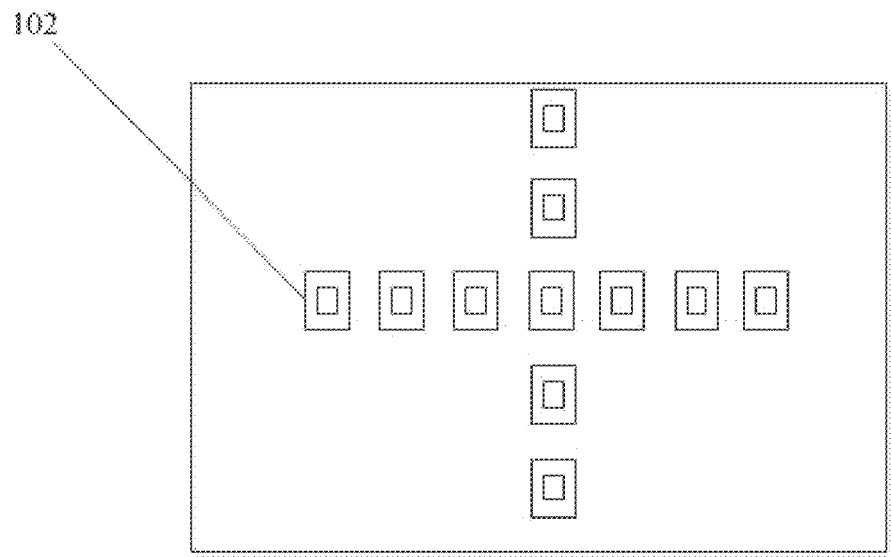
FIG. 16 is a schematic diagram of an arrangement of a LED according to an embodiment of the present invention.
Figure 17:
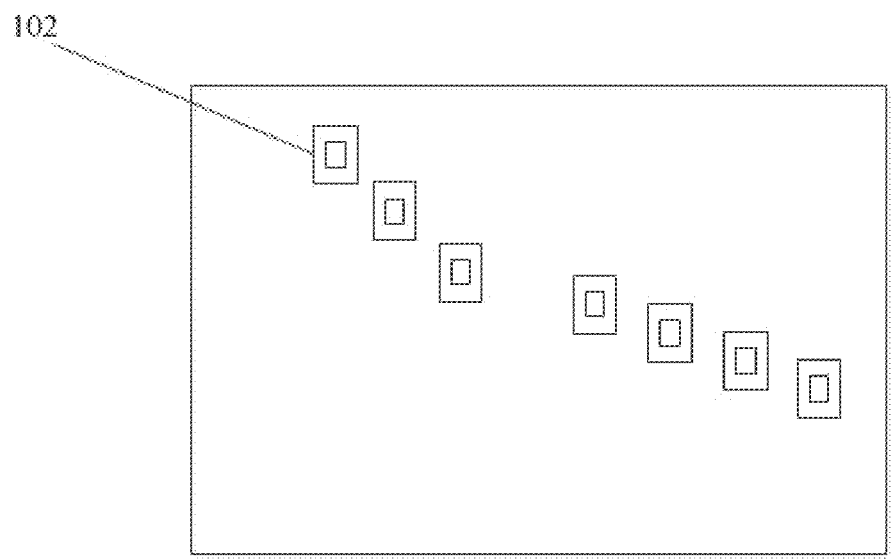
FIG. 17 is a schematic diagram of an arrangement of a LED according to an embodiment of the present invention.
Figure 18:
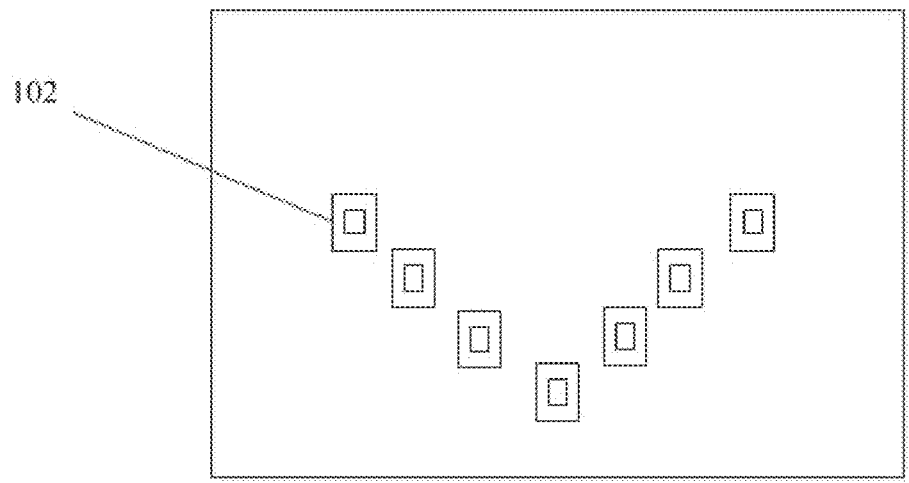
FIG. 18 is a schematic diagram of an arrangement of a LED according to an embodiment of the present invention.

When there are two sets of LEDs, the two sets of LEDs can cross each other as shown in FIG. 16; or can be separately arranged on the circuit substrate as shown in FIG. 17 and FIG. 18. In FIG. 18, the two sets of LEDs are arranged in a herringbone pattern on the circuit substrate with a common vertex.

Figure 19:
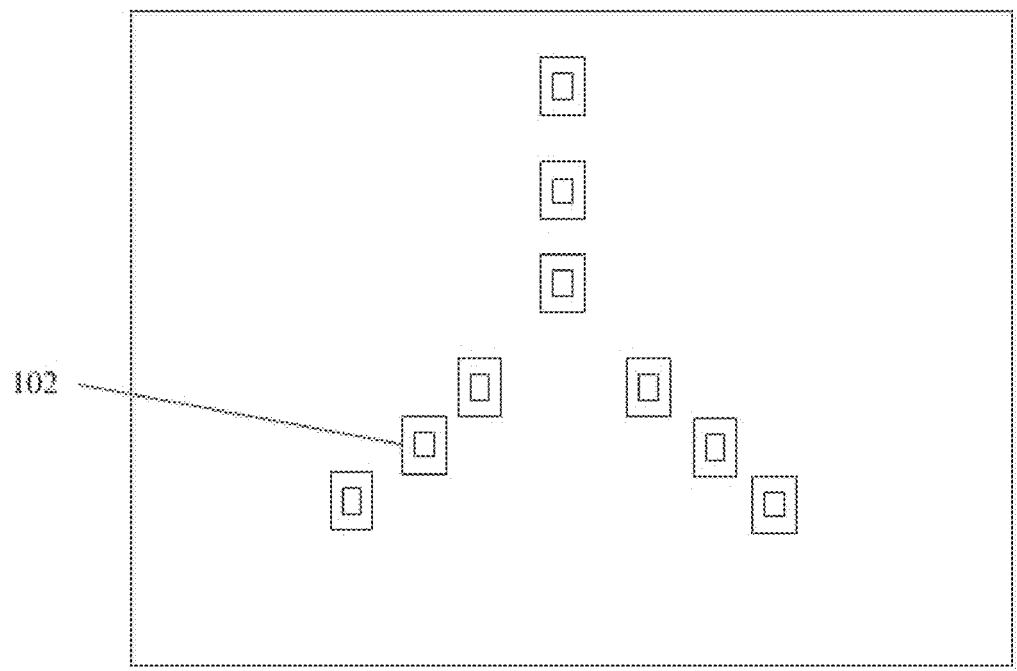
FIG. 19 is a schematic diagram of an arrangement of a LED according to an embodiment of the present invention.

When there are three sets of LEDs, the two sets of LEDs can cross each other to form a herringbone pattern on the circuit substrate, as shown in FIG. 19. Of course, at this time, the three sets of LEDs can also be set to have a common intersection, that is, converge at the center.

In addition, the arrangement directions of the light sources in each set on the circuit substrate are partially same. That is, only some of all sets have their arrangements of the LEDs in the same direction.

Figure 20:
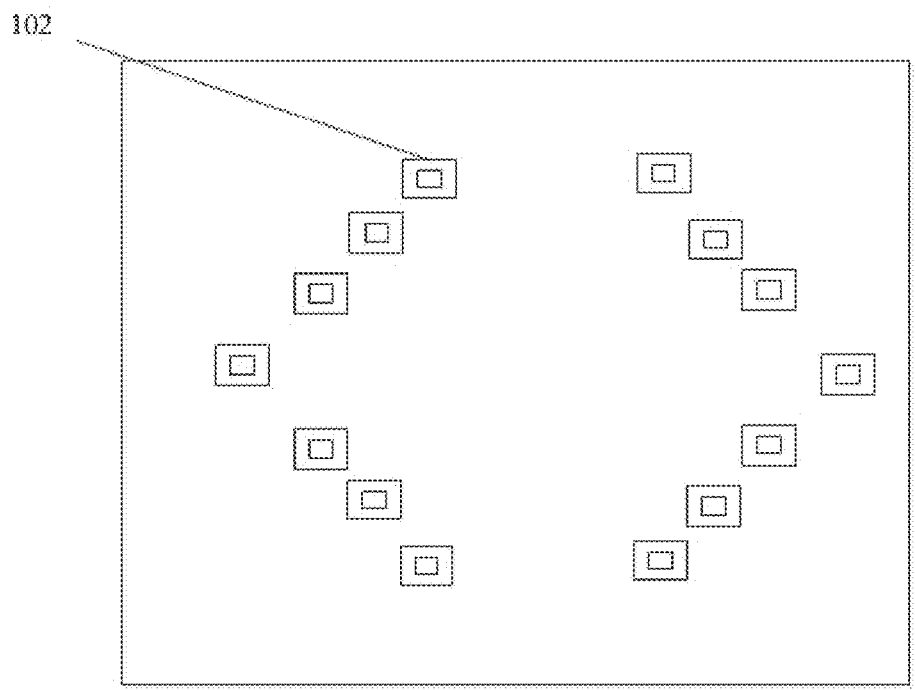
FIG. 20 is a schematic diagram of an arrangement of a LED according to an embodiment of the present invention.

As shown in FIG. 20, a plurality of LEDs are divided into four sets, where the four sets of LEDs are arranged in a parallelogram on the circuit substrate. That is to say, the four sets of LEDs are arranged pairwise in the same direction.

In addition, when the directions of the micro units in the interference elements are different, the circuit substrate can also be arranged in a stereoscopic shape to obtain a more stereoscopic shape.

In an embodiment, different micro units are alternately arranged to form an N-gon, where N is greater than or equal to 3; and the direction of the micro units in the micro units is different from the direction of the micro units in the adjacent micro units. That is to say, the micro units made up of the micro units with same direction are arranged oppositely and the micro units made up of the micro units with different directions are arranged adjacent to each other. And the plurality of LEDs are divided into N sets; the circuit substrate in this case is a stereoscopic shape and has N stepped planes respectively corresponding to the N sets of LEDs; and each set of the LEDs is arranged in an N-gon on each of the stepped planes.

Figures 21A, 21B:
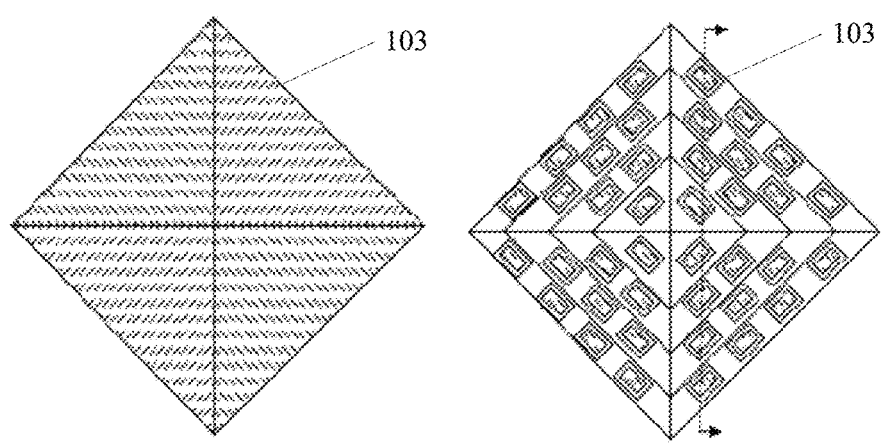
FIG. 21A is a schematic diagram of an arrangement of micro-units according to an embodiment of the present invention.
FIG. 21B is a schematic diagram of an arrangement of a LED according to an embodiment of the present invention.

Taking N=4 as an example, as shown in FIG. 21A, a quadrangular optical element 103 is used and the diagonals of the quadrangles are connected to each other in a straight line, then the quadrangular optical element 103 can be divided into four regions, and the two different micro units of the four regions in the optical elements 103 are alternately arranged with each other. The geometries of the micro units are substantially the same, and the optical element 103 having two different micro units can be integrally formed or formed by means of bonding and fixing.

Figure 21C:
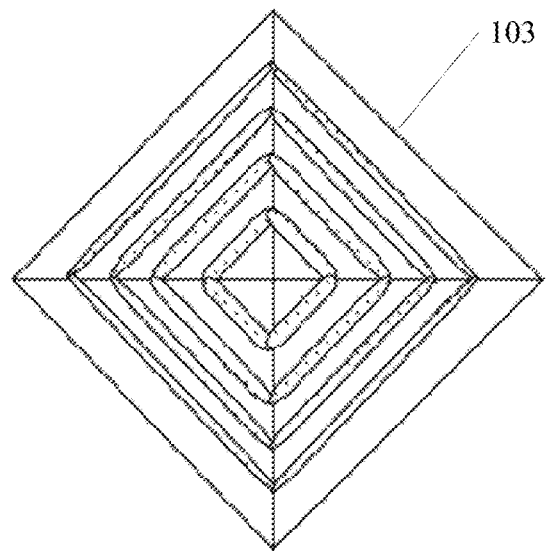
FIG. 21C is a schematic diagram of another optical pattern according to an embodiment of the present invention.

Matching with FIG. 21A, as shown in FIG. 21B, a stereoscopic circuit substrate 101 can be set up. The design of the stereoscopic structure can be arranged substantially in accordance with the shape of the optical element 103. For example, in FIG. 21B, the front area of the optical element 103 is substantially same as that of the stereoscopic circuit substrate, and the optical element can be further arranged with other tenon structures (not shown) that can be fixed by combining with the external mechanism elements. The tenon structures can be integrally formed with optical elements. As shown in FIG. 21C, in the embodiment, a stereoscopic circuit substrate 101 is used, which gradually lowers from the outside to the inside in a stepped manner toward the center. However, the shape of the stereoscopic circuit substrate 101 is not limited and can be designed as, for example, a square, a polygon, a round and other shapes based on requirements. A single or a plurality of LEDs 102 can be arranged in series with each other on the stepped plane of the stereoscopic circuit substrate 101. Afterwards, the optical element 103 is arranged on the LEDs 102. Therefore, when the light sources of the LEDs 102 pass through the corresponding regions of the optical element 103, an elongated optical pattern can be formed in the region. After the optical patterns of the four regions are connected, a quadrilateral elongated optical pattern can be formed as shown in FIG. 21C. In addition, since the LEDs 102 of different steps can form a quadrilateral optical pattern that is gradually reduced from the outside to the inside of the optical element, a stereoscopic quadrilateral optical pattern structure can be formed visually.

Figure 21D:
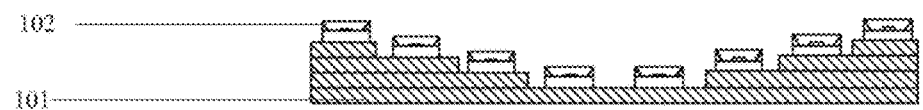
FIG. 21D is a schematic diagram of an arrangement of a LED according to an embodiment of the present invention.

As shown in the embodiment, the circuit substrate 101 has four steps gradually lowering from the outside to the inside. Therefore, four square optical patterns can be finally formed on the optical element 103. The width of each optical pattern will gradually increase from the outside to the inside, so the effect of the stereoscopic vision will be more obvious. It should be understood that the solution of the present invention is not limited to being applied only to a quadrilateral optical pattern, but may also be applied to different stereoscopic optical patterns, such as a polygon, a circle and an oval etc., according to different types of applications. Accordingly, the stereoscopic shape of the circuit substrate 101 is also changed correspondingly. In addition, the width between the optical patterns can also be designed to be gradually reduced from the outside to the inside, and the design method thereof can choose to use LEDs that can emit light with different half power angles. However, the LEDs located in the same stepped plane can also choose the light sources with different half power angles, which can be controlled by different circuits, respectively. In addition, in order to design a polygonal optical pattern, each set of LEDs can be arranged symmetrically with respect to the central axis of the circuit substrate (the side view thereof is shown in FIG. 21D), the emitting light center of the opposite LEDs located on the stepped plane of each opposite side will be on the same x-axis, so that the optical patterns of each side of each polygonal will exhibit the same degree of light uniformity.

In addition, in the polygonal arrangement of LEDs, in order to avoid the visual interference of the lights emitted by the LEDs arranged in different directions, shielding parts can also be arranged under the translucent elements of different micro units. Therefore, the lights emitted by the LEDs in different directions can only penetrate the optical element directly above them, and avoid the phenomenon of visual interference which is generated by the LED side emitting light penetrating the optical elements in other regions.

The material of the shielding parts can be a light absorbing material, and the thickness of the shielding parts can be arranged to not destroy the light intensity uniformity of the optical patterns or result from the optical patterns being connected with each other.

Figure 22:
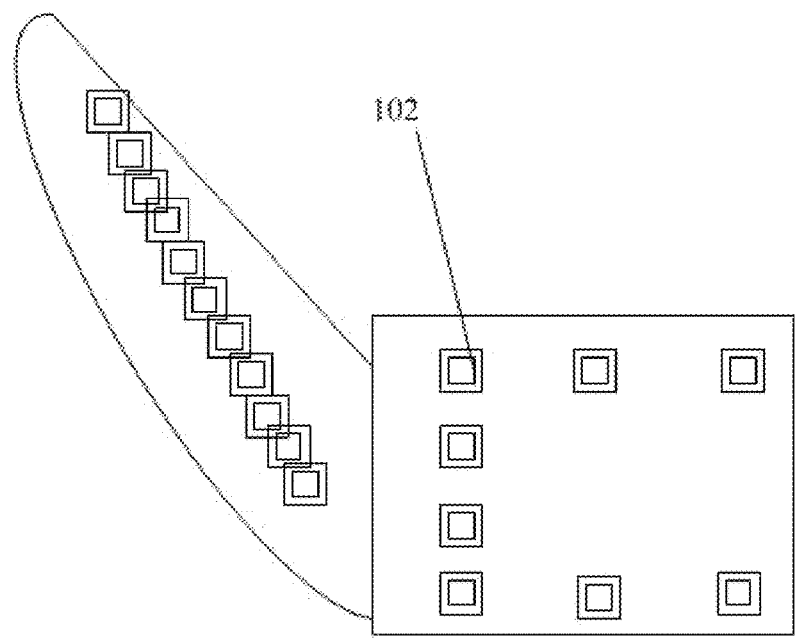
FIG. 22 is a schematic diagram of an arrangement of a LED according to an embodiment of the present invention.

Of course, it is also possible to combine the various arrangement methods described above, that is, the arrangement manner as shown in FIG. 22, to obtain a more diversified optical patterns. It should be noted that, in practical applications, the effect of the optical patterns can be different due to the different positions of observers.

Figure 23A:
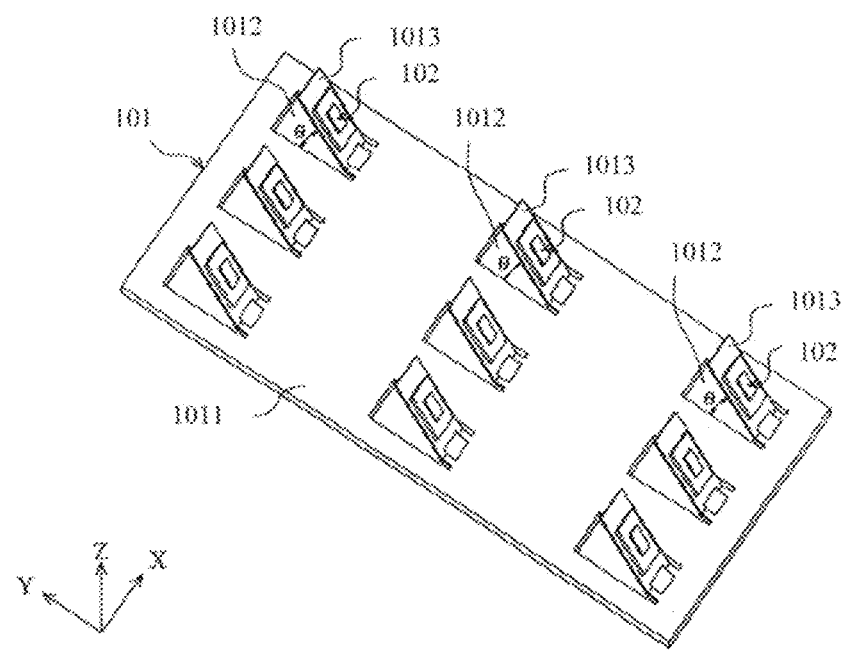
FIG. 23A is a schematic diagram of an arrangement of a LED on a circuit substrate according to an embodiment of the present invention.

Different arrangement manners of the LEDs are mainly described above, and the bending arrangement manner can also be used for the LEDs on the circuit substrate. For example, as shown in FIG. 23A, the circuit substrate 101 can have an outer surface 1011, a plurality of slots 1012 corresponding to a plurality of LEDs, and a plurality of bending structures 1013; the slots 1012 is formed on the outer surface 1011 to form the bending structures 1012 connecting the outer surfaces 1011; the bending structures 1012 protrude from the outer surface 1011 and form angles with the outer surface 1011; and the light sources 102 is arranged on the bending structures 1012. The outer surface 1011 is substantially parallel to the XY plane, and the bending structures 1013 are respectively corresponding to the slots 1012. It should be understood that, the above-mentioned bending structures 1013 protrude from the outer surface 1011 in a Z-axis direction, where an angle θ is formed between the bending structure 1012 and the outer surface 1011, and 0°<θ<180°.

It should be noted that, in the plurality of LEDs, the bending structures corresponding to each LED can be the same or different, when the bending structures corresponding to each LED are the same, a uniform optical pattern will be formed, and when the bending structures corresponding to each LED are different, the pattern with uneven light intensity distribution will be formed. In practice, it can be determined according to specific requirements.

In addition, it can be seen from the above embodiments that a plurality of LEDs can be arranged on the circuit substrate. Then the same or different bending arrangement manners can be used between each set of the LEDs or between each LEDs in one sets. There is no specific limitation here.

More specifically, the circuit substrate can include a substrate and a flexible circuit board. The substrate has a first surface, a plurality of first slots and a plurality of first bending portions corresponding to the plurality of LEDs, respectively, where the first slot is formed on the first surface to form the first bending portion and a connecting portion for connecting the first bending portion and the first surface; the flexible circuit board is combined with the substrate, the flexible circuit board has a second surface, a plurality of second slots and a plurality of second bending portions corresponding to the plurality of LEDs, respectively, where the second slot is formed on the second surface to form the second bending portion, and the second bending portion is connected to the second surface and is combined with the first bending portion. A hole is formed at the adjacent part between the second bending portion and the second surface, and the position of the hole corresponds to the position of the adjacent part. Where the first bending portion and the second bending portion protrude from the second surface and form an included angle with the second surface, the second surface is an outer surface of the circuit substrate, the second slot is a slot of the circuit substrate, and the second bending portion is a bending structure of the circuit substrate; and the LED is arranged on the second bending portion.

Optionally, the first slot is U-shaped.

Optionally, the connecting portion is formed between two sides of the first slot, and the width between the connecting portion and both sides of the first slot is smaller than the width between the first bending portion and both sides of the first slot.

Optionally, the second slot is U-shaped.

Optionally, the LED is a light emitting diode.

In the present embodiment, the circuit substrate 101 is composed of the substrate 30 and the flexible circuit board 40 shown in FIG. 23B and FIG. 23C, and the assembly manner thereof will be described in detail later.

Figure 23B:
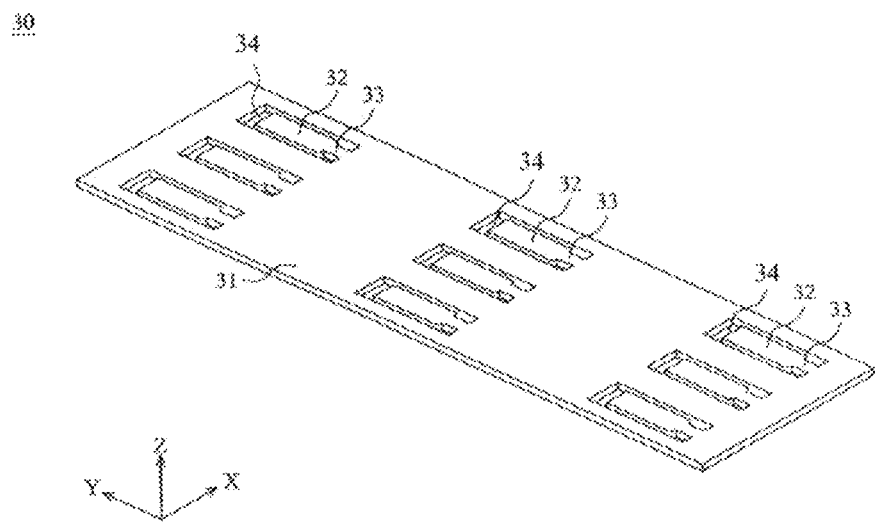
FIG. 23B is a schematic diagram of a substrate according to an embodiment of the present invention.

As shown in FIG. 23B, the substrate 30 in the embodiment can be, for example, an aluminum plate or other thin plates of metal materials. And the substrate 30 has a first surface 31, a plurality of first bending portions 32, a plurality of connecting portions 33 and a plurality of first slots 34. The first surface 31 is substantially parallel to the XY plane, and the first slots 34 are substantially U-shaped. The first slots 34 can be formed on the first surface 31 by punching, thereby forming the first bending portion 32 and the connecting portion 33. As shown in FIG. 23B, the connecting portion 33 is formed between two sides of the first slot 34 for connecting the first bending portion 32 and the first surface 31. A width of the connecting portion 33 in the X-axis direction is smaller than a width of the first bending portion 32 in the X-axis direction.

Figure 23C:
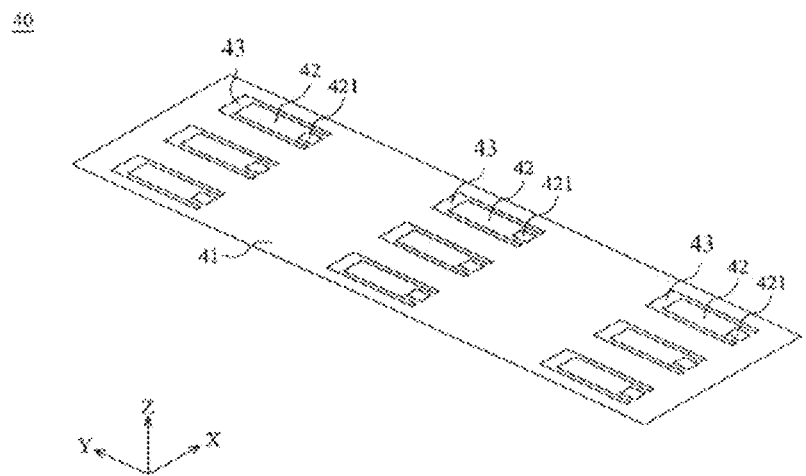
FIG. 23C is a schematic diagram of a flexible circuit substrate according to an embodiment of the present invention.

As shown in FIG. 23C, the flexible circuit board 40 in the embodiment has a second surface 41, a plurality of second bending portions 42, and a plurality of second slots 43. The above-mentioned second surfaces 41 are substantially parallel to the XY plane, the above-mentioned second slots 43 are substantially U-shaped. The second slots 43 can be formed on the second surface 41 by punching, thereby forming a second bending portions 42. It should be particularly illustrated that a hole 421 is formed at the adjacent part between the second bending portion 42 and the second surface 41, and the position of the hole corresponds to the connecting portion 33.

Figure 23D:
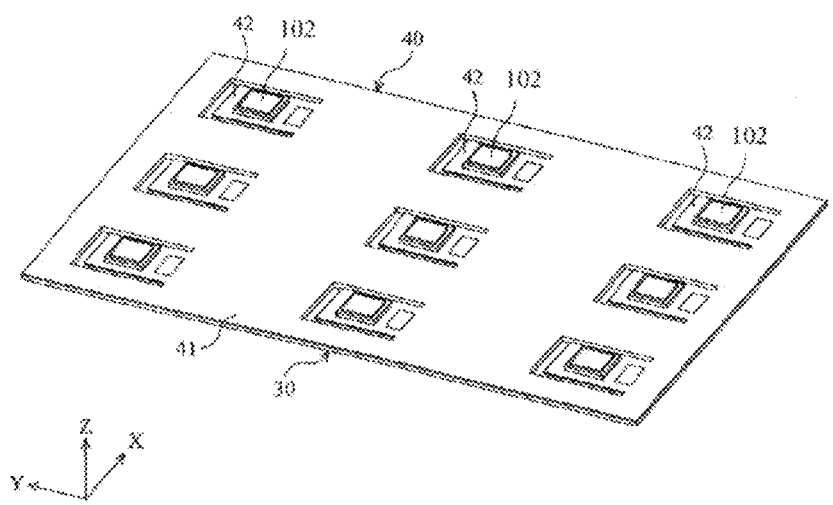
FIG. 23D is a schematic diagram of an arrangement of a LED on a circuit substrate according to an embodiment of the present invention.

As shown in FIG. 23D, after the flexible circuit board 40 and the substrate 30 are combined, the LED 102 can be separately installed on the second bending portion 42. Then, the stereoscopic light emitting apparatus as shown in FIG. 23A can be formed by only simultaneously bending the first bending portions 32 and second bending portions 42 in the Z-axis direction. The bending structure 1012 in FIG. 23A is composed by the above first bending portions 32 and second bending portions 42, and the outer surface 1011 above the circuit substrate 101 refers to the second surface 41 above the flexible circuit board 232.

Figure 23E:
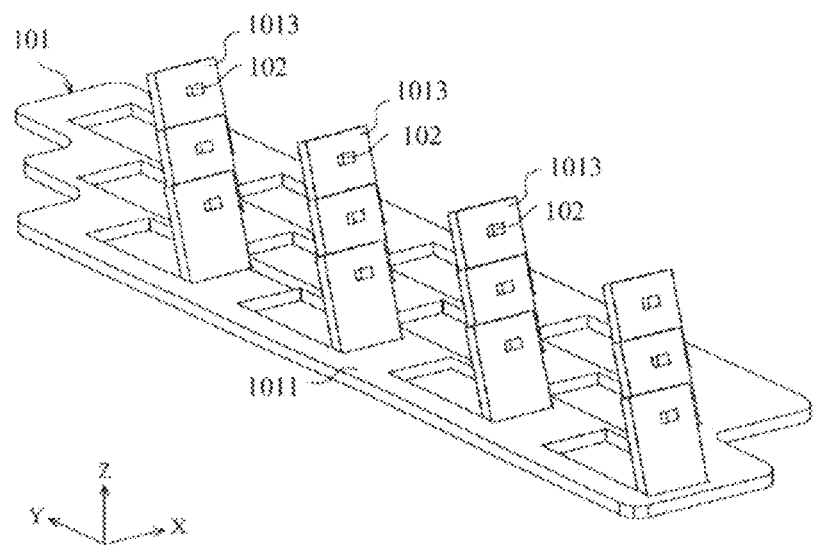
FIG. 23E is a schematic diagram of an arrangement of a LED on a circuit substrate according to an embodiment of the present invention.

In addition, the bending structures 120 and the LEDs 102 can also be arranged in an interleaved manner. As shown in FIG. 23E, a stereoscopic light emitting apparatus can be formed in the same manner, and different visual effects can be generated.

By adopting the bending structure design between the LED and the circuit substrate, the directivity of the light emitted by the LED is more explicit, and thus a more stereoscopic optical pattern is formed on the surface of the optical element.

The light sources used in the above embodiments are mainly light emitting diodes which at least include a light emitting semiconductor wafer. The wafer mainly emits wavelengths of visible lights, such as red, blue, or green and so on. However, the light emitting diodes used in the present invention can also emit wavelengths of invisible lights, such as infrared lights or ultraviolet lights. The materials of the semiconductor can include or consist substantially of GaAs, AlAs, InAs, GaP, AlP, InP, ZnO, CdSe, CdTe, ZnTe, GaN, AlN, InN, silicon and/or alloy or mixture thereof. In addition, the light emitting diode may further include fluorescence, quantum dots or other wavelength conversion materials and so on, so as to convert wavelengths of the original light emitting diode, and then the mixed lights of different colors can be obtained by mixing different wavelengths. For example, the light sources in the present invention can use a semiconductor light emitting wafer which emits blue light, and cover the light emitting wafer with a yellow fluorescent structure, which can include a wavelength conversion material to absorb at least a portion of the light emitted by the semiconductor light emitting wafer and emit the converted lights having different wavelengths. The converted lights combine with the unconverted lights emitted by the semiconductor light emitting wafer to form approximately white light, and the white light can have a correlated color temperature in the range of 2000K to 10000K, and even though the color temperature of the light sources in the present invention is changed due to other external conditions, it will also be within 4 MacAdam Ellipse ranges.

In addition, in order to increase the reliability of the LED, optionally, colloids used in LEDs can be used in combination with colloids having a moisture permeability of less than 10.5 g/m²/24 Hr and an oxygen permeability of less than 382 cm³/m/24 Hr, the combination thereof has better resistance to hydrolysis and degradation, so it can be more suitable for lighting modules with high reliability requirements.

In addition, the size of the semiconductor light emitting wafer used in the present invention can be any size. In some embodiments, the semiconductor light emitting wafer can be selected to have a lateral dimension of less than 500 µm, in other embodiments, the lateral dimension of the semiconductor light emitting wafer is greater than 500 µm. The sizes of smaller semiconductor light emitting wafers can include about 175 µm×250 µm, about 250 µm×400 µm, about 250 µm×300 µm, or about 225 µm×175 µm. The sizes of larger semiconductor light emitting wafers can include about 1000 µm×1000 µm, about 500 µm×500 µm, about 250 µm×600 µm, or about 1500 µm×500 µm. In some embodiments, the semiconductor light emitting wafers include or substantially consist of a plurality of small semiconductor light emitting wafers, which are also referred to as "Micro-LED wafer". Micro-LED wafer generally has a lateral dimension of less than about 300 µm. In some embodiments, the lateral dimension of Micro-LED wafer is less than about 200 µm or even less than about 100 µm. For example, a Micro-LED wafer has a size of about 225 µm×175 µm, about 150 m×100 µm, or about 150 µm×50 µm. In some embodiments, the surface area of the top surface of the Micro-LED wafer is less than 50000 µm² or less than 10000 µm². The size of the LED wafer is not a limitation of the present invention. In other embodiments, the LED wafer can be relatively large. For example, the LED wafer can have a lateral dimension on the order of at least about 1000 µm or at least about 3000 µm.

In the present invention, the LED can include a fluorescent layer, which contains a substrate and a fluorescent substance. The substrate of the fluorescent layer can be a ceramic material or a resin material. The ceramic material is preferably silica; and the resin material is preferably epoxy resin or silicone resin. The fluorescent substance can use one or more selected from the following components: $(Sr,Ba)Si_2(O,Cl)_2N_2:Eu^{2+}$, $Sr_5(PO_4)_3Cl:Eu^{2+}$, $(Sr,Ba)MgAl_{10}O_{17}:Eu^{2+}$, $(Sr,Ba)_3MgSi_2O_8:Eu^{2+}$, $SrAl_2O_4:Eu^{2+}$, $SrBaSiO_4:Eu^{2+}$, $CdS:In$, $CaS:Ce^{3+}$, $(Y,Lu,Gd)_3(Al,Ga)_5O_{12}:Ce^{3+}$, $Ca_3Sc_2Si_3O_{12}:Ce^{3+}$, $SrSiON:Eu^{2+}$, $ZnS:Al^{3+}$, $Cu^+$, $CaS:Sn^{2+}$, $CaS:Sn^{2+}$, $F$, $CaSO4:Ce^{3+}$, $Mn^{2+}$, $LiAlO_2:Mn^{2+}$, $BaMgAl_{10}O_{17}:Eu^{2+}$, $Mn^{2+}$, $ZnS:Cu^+$, $Cl^-$, $Ca_3WO_6:U$, $Ca_3SiO_4Cl_2:Eu^{2+}$, $Sr_xBa_yCl_zAl_2O_{4-z/2}:Ce^{3+},Mn^{2+}$ (X:0.2, Y:0.7, Z:1.1), $Ba_2MgSi_2O_7:Eu^{2+}$, $Ba_2SiO_4:Eu^{2+}$, $Ba_2Li_2Si_2O_7:Eu^{2+}$, $ZnO:S$, $ZnO:Zn$, $Ca_2Ba_3(PO_4)_3Cl:Eu^{2+}$, $BaAl_2O_4:Eu^{2+}$, $SrGa_2S_4:E^{2+}$, $ZnS:Eu^{2+}$, $Ba_5(PO_4)_3Cl:U$, $Sr_3WO_6:U$, $CaGa_2S_4:Eu^{2+}$, $SrSO_4:Eu^{2+}$, $Mn^{2+}$, $ZnS:P$, $ZnS:P^{3-},Cl^-$, $ZnS:Mn^{2+}$, $CaS:Yb^{2+},Cl$, $Gd_3Ga_4O_{12}:Cr^{3+}$, $CaGa_2S_4:Mn^{2+}$, $Na(Mg,Mn)_2LiSi_4O_{10}F_2:Mn$, $ZnS:Sn^{2+}$, $Y_3Al_5O_{12}:Cr^{3+}$, $SrB_8O_{13}:Sm^{2+}$, $MgSr_3Si_2O_8:Eu^{2+}$, $Mn^{2+}$, $\alpha\text{-}SrO.3B_2O_3:Sm^{2+}$, $ZnS\text{—}CdS$, $ZnSe:Cu+$, $Cl$, $ZnGa_2S_4:Mn^{2+}$, $ZnO:Bi^{3+}$, $BaS:Au,K$, $ZnS:Pb^{2+}$, $ZnS:Sn^{2+}$, $Li^+$, $ZnS:Pb,Cu$, $CaTiO_3:Pr^{3+}$, $CaTiO_3:Eu^{3+}$, $Y_2O_3:Eu^{3+}$, $(Y,Gd)_2O_3:Eu^{3+}$, $CaS:Pb^{2+}$, $Mn^{2+}$, $YPO_4:Eu^{3+}$, $Ca_2MgSi_2O_7:Eu^{2+}$, $Mn^{2+}$, $Y(P,V)O_4:Eu^{3+}$, $Y_2O_2S:Eu^{3+}$, $SrAl_2O_7:Eu^{3+}$, $CaYAlO_4:Eu^{3+}$, $LaO_2S:Eu^{3+}$, $LiW_2O_8:Eu^{3+},Sm^{3+}$, $(Sr,Ca,Ba,Mg)_{10}(PO_4)_6Cl_2:Eu^{2+}$, $Mn^{2+}$, $Ba_3MgSi_2O_8:Eu^{2+}$, $Mn^{2+}$, $ZnS:Mn^{2+}$, $Te^{2+}$, $Mg_2TiO_4:Mn^{4+}$, $K_2SiF_6:Mn^{4+}$, $SrS:Eu^{2+}$, $Na_{1.23}K_{0.42}Eu_{0.12}TiSi_4O_{11}$, $Na_{1.23}K_{0.42}Eu_{0.12}TiSi_5O_{13}:Eu^{3+}$, $CdS:In$, $Te$, $(Sr,Ca)AlSiN_3:Eu^{2+}$, $CaSiN_3:Eu^{2+}$, $(Ca,Sr)_2Si_5N_8:Eu^{2+}$, and $Eu_2W_2O_7$.

The light emitting apparatus provided in the embodiments of the present invention can be used in various lighting modules, such as a tail lamp design, a brake lamp design, a headlamp design, or a vehicle interior lighting, so as to provide more diversified optical patterns and improve user experience.

The present invention also provides a lighting module, including the light emitting apparatus according to any one of the above embodiments and a control circuit, where the control circuit is configured to control the on and off of the plurality of light sources of the light emitting apparatus.

Figure 24:
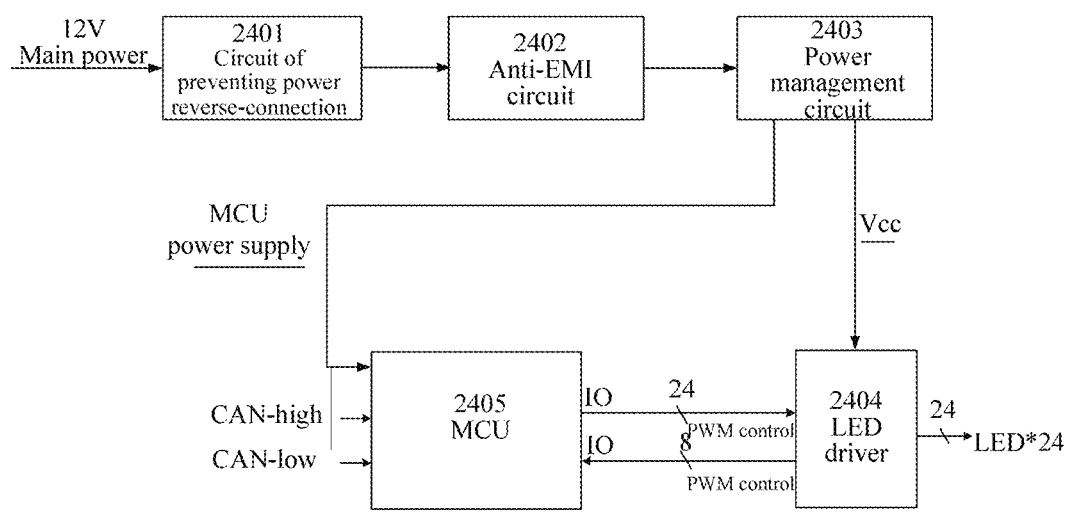
FIG. 24 is a structural diagram of a control circuit according to an embodiment of the present invention.

In an embodiment, the LEDs in the light emitting apparatus can be controlled through the control circuit. FIG. 24 is a structural diagram of a control circuit according to an embodiment of the present invention. As shown in FIG. 24, the control circuit can be arranged on the circuit substrate of the light emitting apparatus, and includes a power supply unit and a driving unit. The power supply unit further includes a circuit of preventing power reverse-connection 2401, which provides power for the control circuit and is used to prevent power supply from being connected reversely; an anti-electromagnetic interference (EMI) circuit 2402 and a power management circuit 2403. The driving unit further includes a Microprogrammed Control Unit (MCU) 2405 and a LED driver 2404. The main power supplies the input voltage to the circuit of preventing power reverse-connection 2401 which is electrically connected to the anti-EMI circuit 2402. Then, the output of the anti-EMI circuit 2402 is used as an input to the power management circuit 2403, and the power management circuit 2403 supplies a voltage Vcc to the LED driver 2404 and supplies a voltage input to the MCU 2405. Here, the LED driver is electrically connected to each LED for driving each LED, and the MCU is used to provide pulse-width modulation (PWM) to the LED driver.

The following is a brief description of the control process of the control circuit. When the MCU is powered, it can output pulses to the LED driver, and the pulses can be input to the LED driver, so that the LED driver can drive the LED based on these pulses. Therefore, it can be achieved by adjusting the pulse output by the MCU that which LED needs to be lit and how long the LED is lit. In addition, the LED driver also outputs error detection to the MCU as feedback to improve the control accuracy of the LED. For example, as shown in FIG. 24, the LED driver is connected to 24 LEDs, therefore, the MCU can output 24 pulses to the LED driver for PWM control. Of course, the number shown in FIG. 24 is only an example, but not limited thereto. The number can be adjusted according to actual requirements.

It should be noted that, for the specific structures and principles of the circuit of preventing power reverse-connection, the anti-EMI circuit and the power management circuit described above, reference can be made to the related content in the prior art, and no more details here.

In addition, it is mentioned in the foregoing embodiments that multiple sets of control circuits can be provided to control multiple sets of LEDs, respectively, where the structures of each set of control circuits can be implemented with reference to FIG. 24. Moreover, by adjusting the pulse output by the MCU, the control circuit can be used to control the LEDs to light in sequence, thereby obtaining different optical patterns displayed in sequence.

The embodiments described above are only the embodiments of the present invention, and do not limit the scope of the present invention. An equivalent structure or an equivalent process alternate made by using the description and drawing contents of the present invention, or those made directly or indirectly by using the technical solutions in other related technical fields are equally included in the scope of the present invention.

Finally, it should be noted that each of the above embodiments is only used for illustrating the technical solutions of embodiments of the present invention, rather than limiting them; although the embodiments of the present invention are illustrated in detail with reference to each of the aforementioned embodiments, those ordinary skilled in the art should understand: the technical solutions recorded in each of the aforementioned embodiments can still be amended, or part or all of the technical features can be substituted comparably; however, these modifications or substitutions do not make the essence of the corresponding technical solutions depart from the scope of the embodiment solutions of the present invention.

The invention claimed is:

1. A light emitting apparatus, comprising: a circuit substrate, a plurality of optical sources and an optical element; wherein the optical element comprises a translucent element and an interference element;
   the plurality of light sources are arranged on the circuit substrate for lighting the optical element;
   the optical element is arranged above the plurality of light sources; and the interference element is arranged on the translucent element, and the interference element is used to make light emitted from each of the light sources offset interference in a first polarization direction, enhance interference in a second polarization direction, and emit through the translucent element.

2. The light emitting apparatus according to claim 1, wherein a surface of the optical element facing the light sources is curved along the direction away from the light sources.

3. The light emitting apparatus according to claim 1, wherein the interference element is made of micro units with a same direction.

4. The light emitting apparatus according to claim 3, wherein the plurality of light sources are arranged in series with each other and linearly arranged on the circuit substrate along a direction same as the direction of the micro units.

5. The light emitting apparatus according to claim 4, wherein the plurality of light sources are divided into at least two sets, half power angles of the light sources in a same set are the same, and half power angles of the light sources in different sets are different; and half power angle of a light source is different from half power angle of an adjacent light source arranged on two adjacent sides of the light source.

6. The light emitting apparatus according to claim 4, wherein the plurality of light sources are divided into at least two sets and half power angle of each of the light sources is the same; and a height of a surface of the circuit substrate where a light source is located is different from a height of a surface of the circuit substrate where an adjacent light source arranged on two adjacent sides of the light source are located.

7. The light emitting apparatus according to claim 3, wherein the plurality of light sources are arranged in series with each other and linearly arranged on the circuit substrate along a direction different from the direction of the micro units.

8. The light emitting apparatus according to claim 3, wherein the plurality of light sources are divided into at least two sets; and the light sources in each set are connected in series with each other, and linearly arranged on the circuit substrate along a direction different from the direction of the micro units.

9. The light emitting apparatus according to claim 8, wherein different sets of the light sources are arranged parallel to each other on the circuit substrate.

10. The light emitting apparatus according to claim 9, wherein the plurality of light sources are divided into three sets, and a surface of the circuit substrate where the set of light sources arranged in the middle is located is lower than a surface of the circuit substrate where the two sets of light sources on two adjacent sides are located.

11. The light emitting apparatus according to claim 8, wherein different sets of light sources are arranged in different directions on the circuit board.

12. The light emitting apparatus according to claim 11, wherein the plurality of light sources are divided into two sets, and the two sets of the light sources are arranged in a herringbone on the circuit substrate.

13. The light emitting apparatus according to claim 11, wherein the plurality of light sources are divided into three sets, and the three sets of light sources are arranged in a herringbone on the circuit substrate.

14. The light emitting apparatus according to claim 8, wherein the arrangement directions of the each set of the light sources on the circuit substrate are partially same.

15. The light emitting apparatus according to claim 14, wherein the plurality of light sources are divided into four sets, and the four sets of light sources are arranged in a parallelogram on the circuit substrate.

16. The light emitting apparatus according to claim 1, wherein the interference element comprises at least two types of micro units, and there are a plurality of the micro units in each type; and the directions of the micro units of the same type are the same, and the directions of the micro units of different types are different.

17. The light emitting apparatus according to claim 16, wherein the different micro units are alternately arranged to form an N-gon, and N is greater than or equal to 3; and the direction of the micro units in the micro units is different from directions of micro units in adjacent micro units;

the plurality of light sources are divided into N sets; the circuit substrate is a stereoscopic shape and has N stepped planes respectively corresponding to the N sets of light sources; and the each set of light sources are arranged in an N-gon on each of the stepped planes.

18. The light emitting apparatus according to claim 17, wherein the each set of the light sources are symmetrically distributed with respect to a central axis of the circuit substrate.

19. The light emitting apparatus according to claim 17, wherein a blocking portion is arranged below the translucent element on which the different micro units are arranged.

20. The light emitting apparatus according to claim 1, wherein a tenon structure is arranged on the translucent element, and the microstructure is arranged on the tenon structure.

21. The light emitting apparatus according to claim 1, wherein the plurality of light sources are arranged at equal intervals from each other.

22. The light emitting apparatus according to claim 8, wherein the plurality of light sources in the each set are arranged at equal intervals from each other.

23. The light emitting apparatus according to claim 1, wherein the circuit substrate has an outer surface, a plurality of slots and a plurality of bending structures corresponding to the plurality of light sources, respectively;

the slots are formed on the outer surface to form the bending structure connecting with the outer surface;
the bending structure protrudes from the outer surface and forms an included angle with the outer surface; and
the light sources are arranged on the bending structure.

24. The light emitting apparatus according to claim 1, wherein the light sources are light emitting diodes, and the light emitting diodes are made of colloid, and humidity and oxygen permeability of the colloid is lower than a preset value.

25. The light emitting apparatus according to claim 1, wherein the light sources are light emitting diodes, the light emitting diodes are coated with fluorescent layers which comprise base materials and fluorescent materials, and the base materials are made of ceramic materials or resin materials.

26. The light emitting apparatus according to claim 3, wherein the micro units are arranged to form a concave-convex surface, and distance between a lowest point and a highest point of the concave-convex surface is no more than 500 microns.

27. A lighting module, comprising: the light emitting apparatus according to claim 1 and a control circuit, wherein the control circuit is configured to control the on and off of the plurality of light sources in the light emitting apparatus.

28. The lighting module according to claim 27, wherein the control circuit comprises a power supply unit and a driving unit; and the driving unit comprises a microcontroller and a light source driver;

the power supply unit is electrically connected with the microcontroller and the light source driver, and powers the microcontroller and the light source driver, respectively;
the microcontroller is electrically connected to the light source driver for modulating pulse width of the light source driver; and
the light source driver is electrically connected to the plurality of light sources for driving the plurality of light sources.

29. The lighting module according to claim 27, wherein the control circuit is configured to light the plurality of light sources according to a preset time sequence.

* * * * *